(12) United States Patent
Peng et al.

(10) Patent No.: US 9,735,102 B2
(45) Date of Patent: Aug. 15, 2017

(54) HIGH VOLTAGE DEVICE

(71) Applicant: GLOBALFOUNDRIES Singapore Pte. Ltd., Singapore (SG)

(72) Inventors: Lulu Peng, Singapore (SG); Donald Ray Disney, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/660,955

(22) Filed: Mar. 18, 2015

(65) Prior Publication Data

US 2016/0276269 A1    Sep. 22, 2016

(51) Int. Cl.
| | |
|---|---|
| H01L 23/52 | (2006.01) |
| H01F 27/28 | (2006.01) |
| H01F 1/14 | (2006.01) |
| H01F 27/24 | (2006.01) |
| H01L 23/522 | (2006.01) |
| H01F 1/147 | (2006.01) |
| H01L 49/02 | (2006.01) |

(52) U.S. Cl.
CPC ..... *H01L 23/5227* (2013.01); *H01F 1/14708* (2013.01); *H01F 27/24* (2013.01); *H01F 27/2804* (2013.01); *H01L 28/10* (2013.01); H01F 2027/2809 (2013.01)

(58) Field of Classification Search
CPC ............ H01L 23/5227; H01L 28/10; H01F 27/2804; H01F 1/14708; H01F 27/24; H01F 2027/2809
USPC .......................................................... 257/531
See application file for complete search history.

(56) References Cited

U.S. PATENT DOCUMENTS

| | | | | |
|---|---|---|---|---|
| 4,760,009 A | * | 7/1988 | Larson .................. | G03G 9/12 430/114 |
| 2010/0225436 A1 | * | 9/2010 | Papavasiliou ....... | H01F 17/0013 336/200 |
| 2011/0018676 A1 | * | 1/2011 | Young ...................... | H01F 3/00 336/84 C |

(Continued)

OTHER PUBLICATIONS

David I Anderson, Applications of PSIP/PSOC Products, Power SOC, 2012, Texas Instruments, USA.

(Continued)

*Primary Examiner* — John C Ingham
*Assistant Examiner* — Didarul Mazumder
(74) *Attorney, Agent, or Firm* — Horizon IP PTE Ltd.

(57) ABSTRACT

Devices and methods of forming a device are disclosed. The method includes providing a wafer that includes a center insulator layer sandwiched by a top substrate and a bottom substrate. Both sides of the wafer are patterned and etched in sequence to form deep trenches in both substrates. A conductive seed layer is formed on both sides of the wafer in sequence to cover all exposed areas. Both sides of the wafer are electroplated simultaneously to fill both deep trenches with a conductive material. Both sides of the wafer are polished in sequence to form a coplanar surface. A protective layer is deposited on both sides of the wafer in sequence. Selective portions of the protective layer on both sides are patterned and etched in sequence to expose micro bump bonding areas. Micro bumps are formed on both sides of the wafer in sequence to facilitate electrical connection.

19 Claims, 23 Drawing Sheets

(56) References Cited

U.S. PATENT DOCUMENTS

| | | | | |
|---|---|---|---|---|
| 2011/0279186 A1* | 11/2011 | Hirota | ............... | H03B 5/1228 |
| | | | | 331/117 FE |
| 2012/0126926 A1* | 5/2012 | Kroener | ............. | H01F 27/2804 |
| | | | | 336/199 |
| 2013/0113448 A1* | 5/2013 | Shapiro | ............. | H01L 23/49822 |
| | | | | 323/282 |
| 2013/0168809 A1* | 7/2013 | Yen | ................. | H01L 23/5227 |
| | | | | 257/531 |
| 2015/0028984 A1* | 1/2015 | Kang | ............... | H01F 17/0006 |
| | | | | 336/192 |

OTHER PUBLICATIONS

J. Ted Dibene, Fine Grain On-die Integrated Magnetics: Breaking the Power/Performance Barriers , 2012, Intel, USA.

Noah Sturcken et al., A 2.5D Integrated Voltage Regulator Using Coupled-Magnetic-Core Inductors on Silicon Interposer, IIEEE Journal of Solid-State Circuits, Jan. 2013, vol. 48, No. 1, USA.

Dok Won Lee et al., Fabrication and Analysis of High-Performance Integrated Solenoid Inductor With Magnetic Core, IEEE Transactions on Magnetics, Nov. 2008, vol. 44, No. 11, University of Stanford University, USA.

Rongxiang Wu et al., A Novel Silicon-Embedded Coreless Inductor for High-Frequency Power Management Applications, IEEE Electron Device Letters, Jan. 2011, vol. 32, No. 1, Hong Kong.

Guruprasad Katti et al., A Cost-Effective Platform for Heterogeneous 2.5D ICs, Chip Scale Review, The International Magazine for the Semiconductor Packaging Industry, 2014, pp. 16-20, 2014, vol. 18, No. 3, Institute of Microelectronics.

* cited by examiner

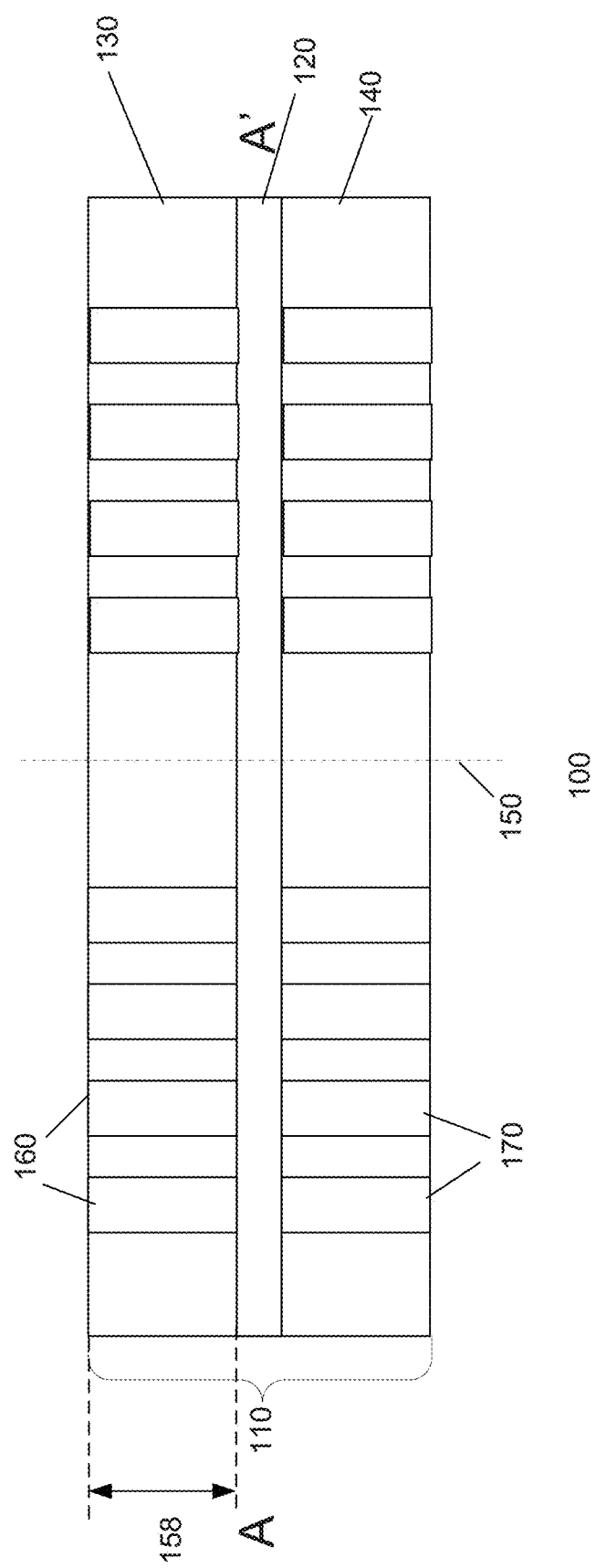

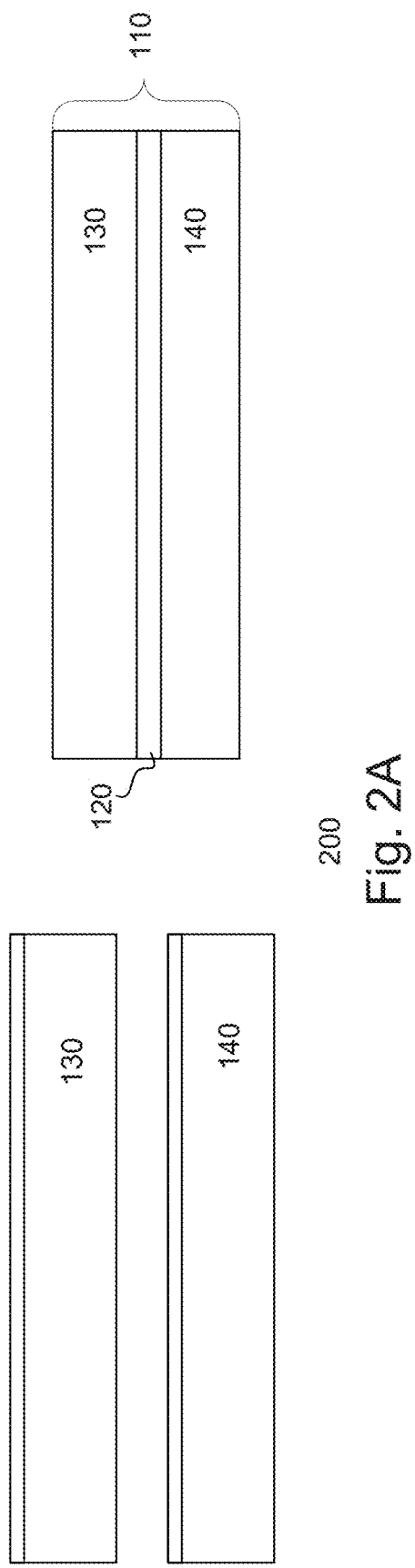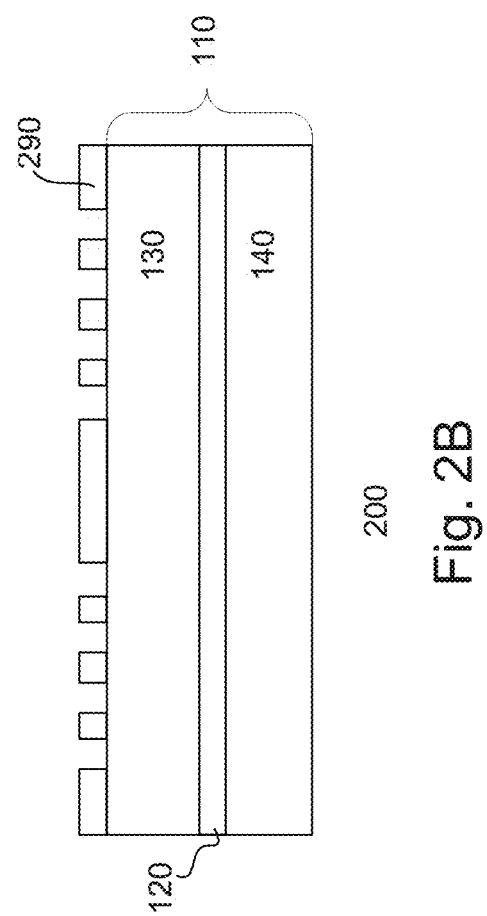

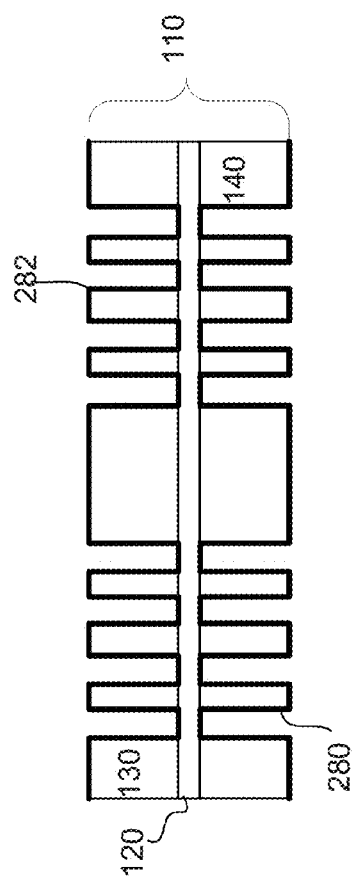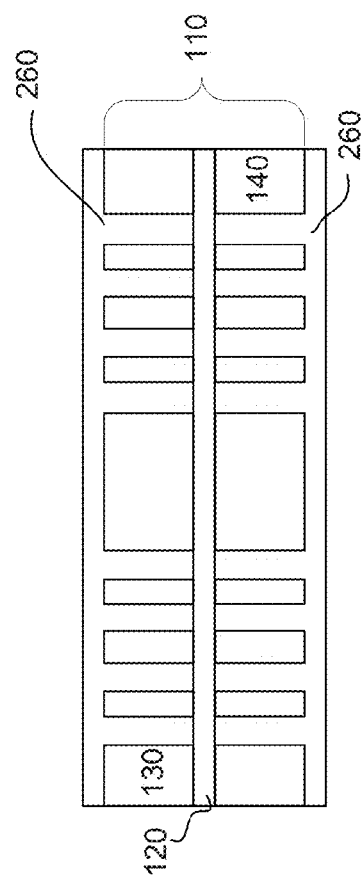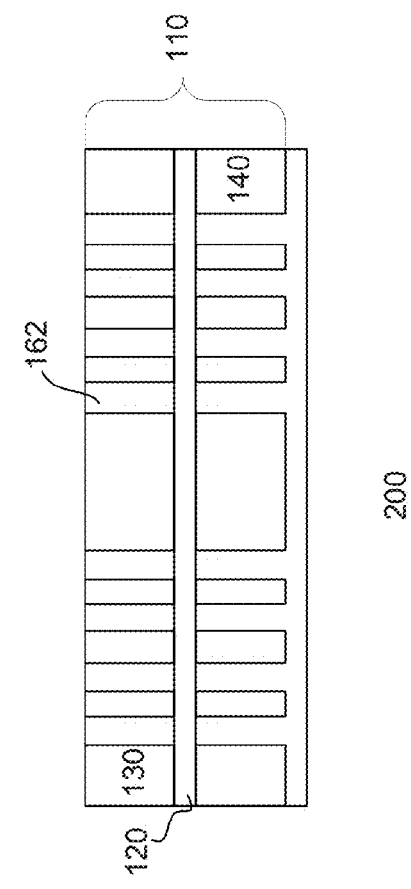

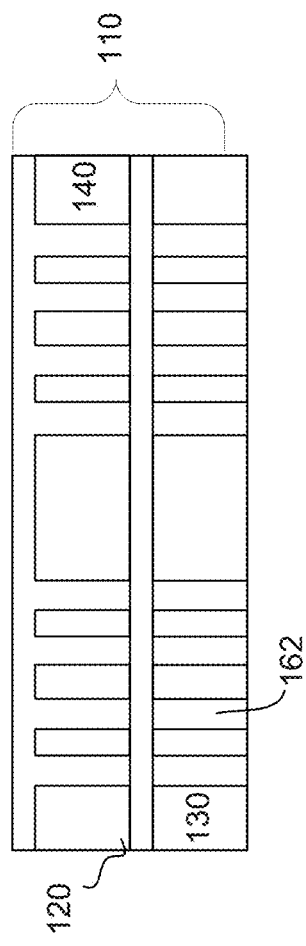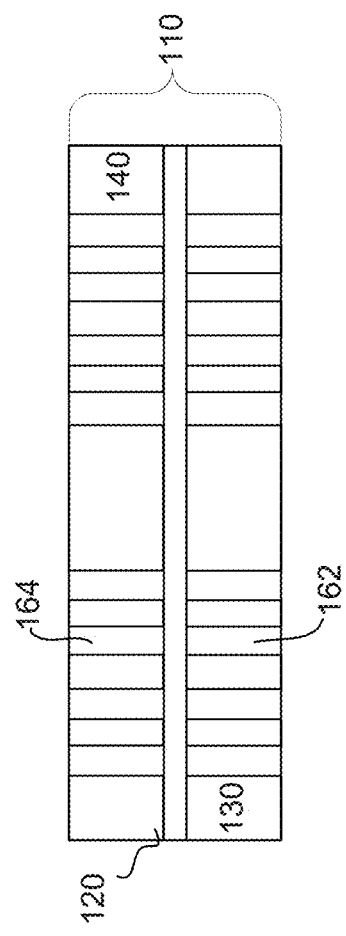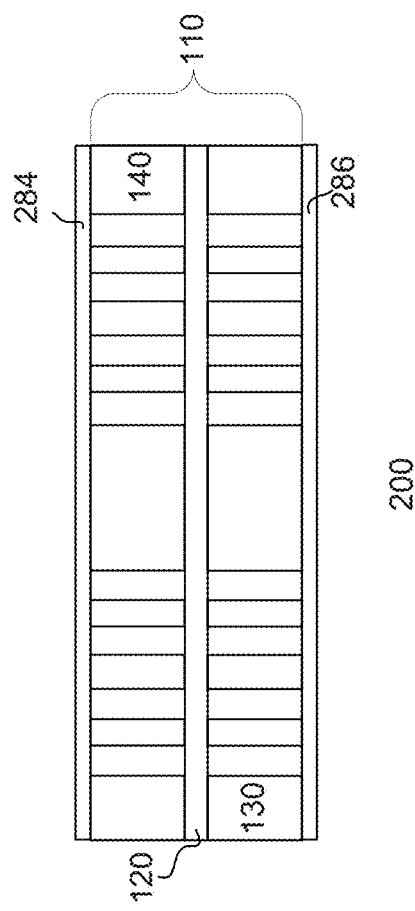

| Specification | Target | Device 100 |
|---|---|---|
| DC resistance | 50 mΩ | 92.5 mΩ |
| DC Inductance | 5 nH | 9 nH |
| FOM(DC): L/RDCnH/mΩ | 0.1 | 0.097 |
| FOM(AC): Q-factor | NA | 14 |
| Efficiency: ηL | 90% | 95.3% |
| EMI concern | NA | Yes |

Fig. 4

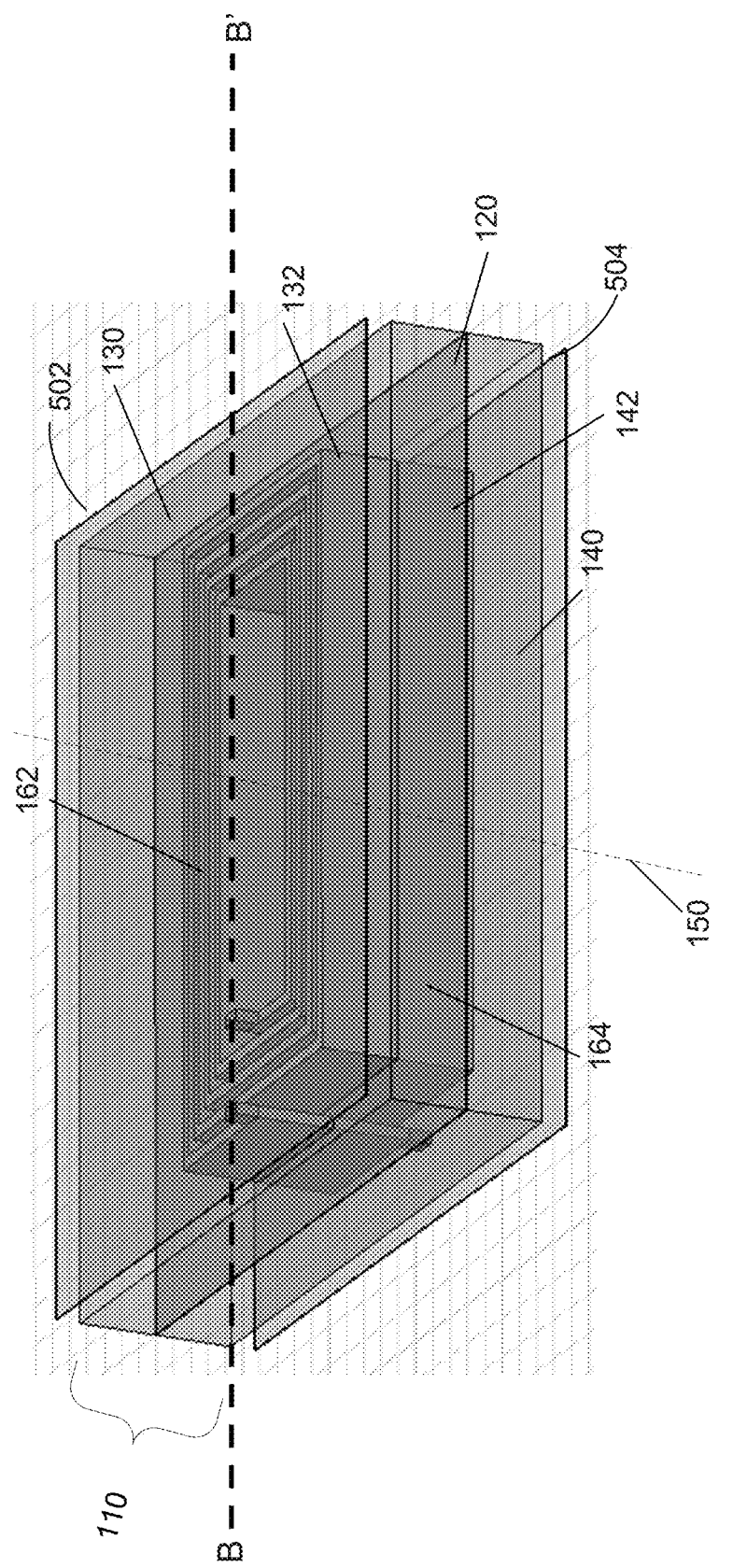

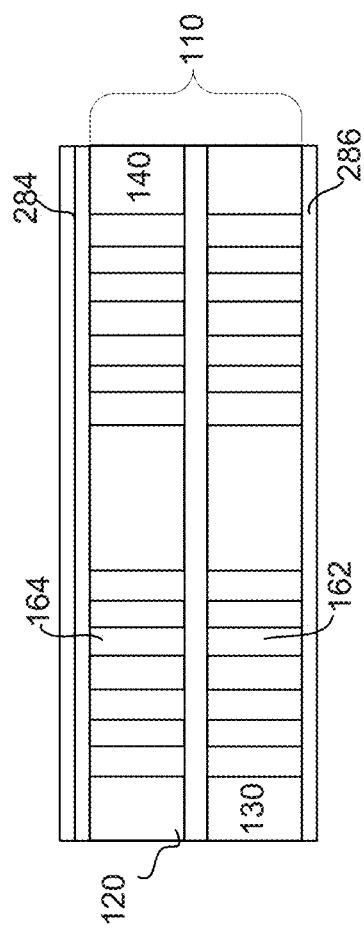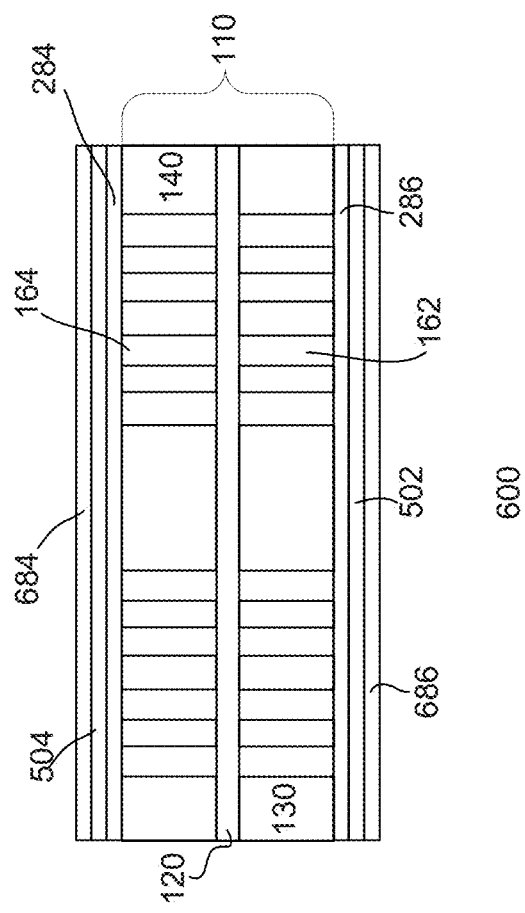

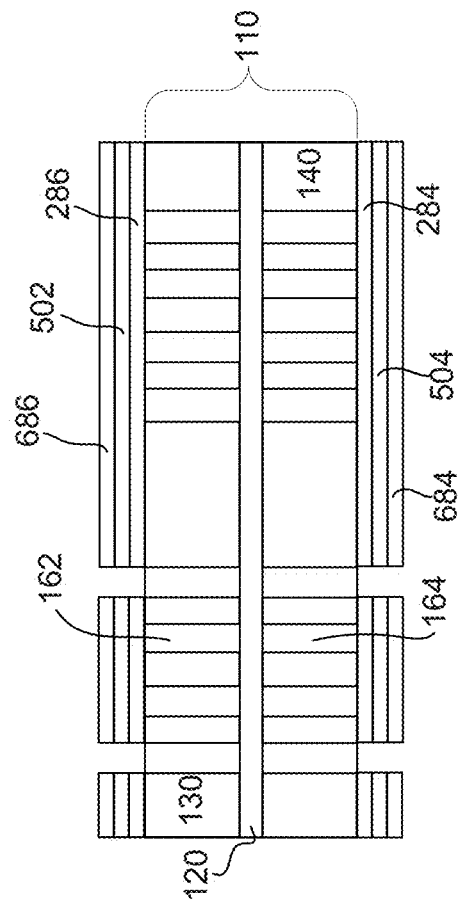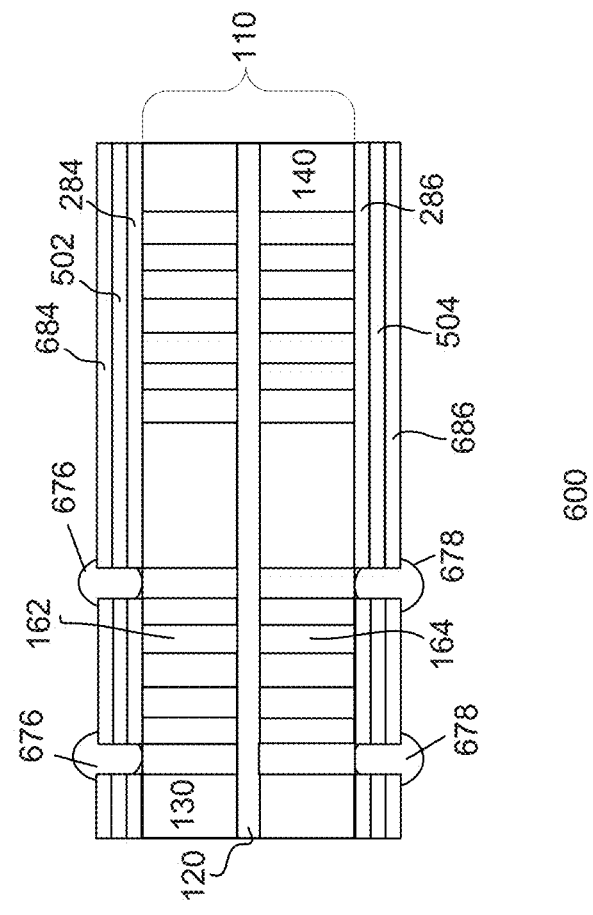
Fig. 6C
Fig. 6D

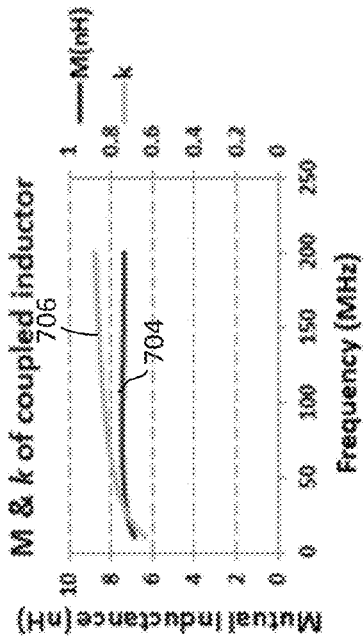
Fig. 7A
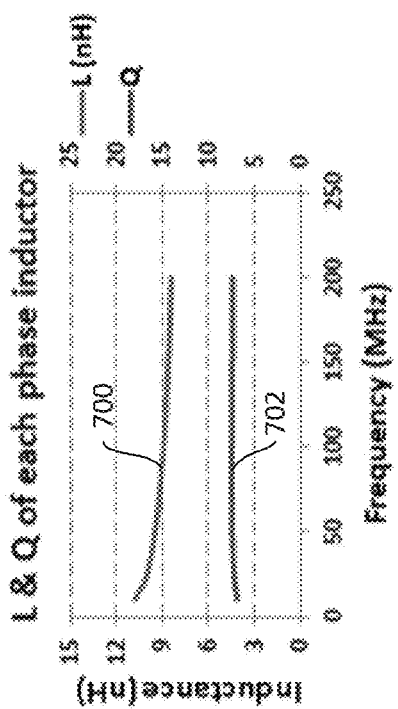
Fig. 7B
| Specification | Target | Device 500 |
|---|---|---|
| DC resistance | 50 mΩ | 92.5 mΩ |
| DC Inductance | 5 nH | 10.8 nH |
| FOM(DC): L/RDCnH/mΩ | 0.1 | 0.117 |
| FOM(AC): Q-factor | NA | 6.8 |
| Efficiency: ηL | 90% | 94.3% |
| EMI concern | NA | None |
Fig. 8

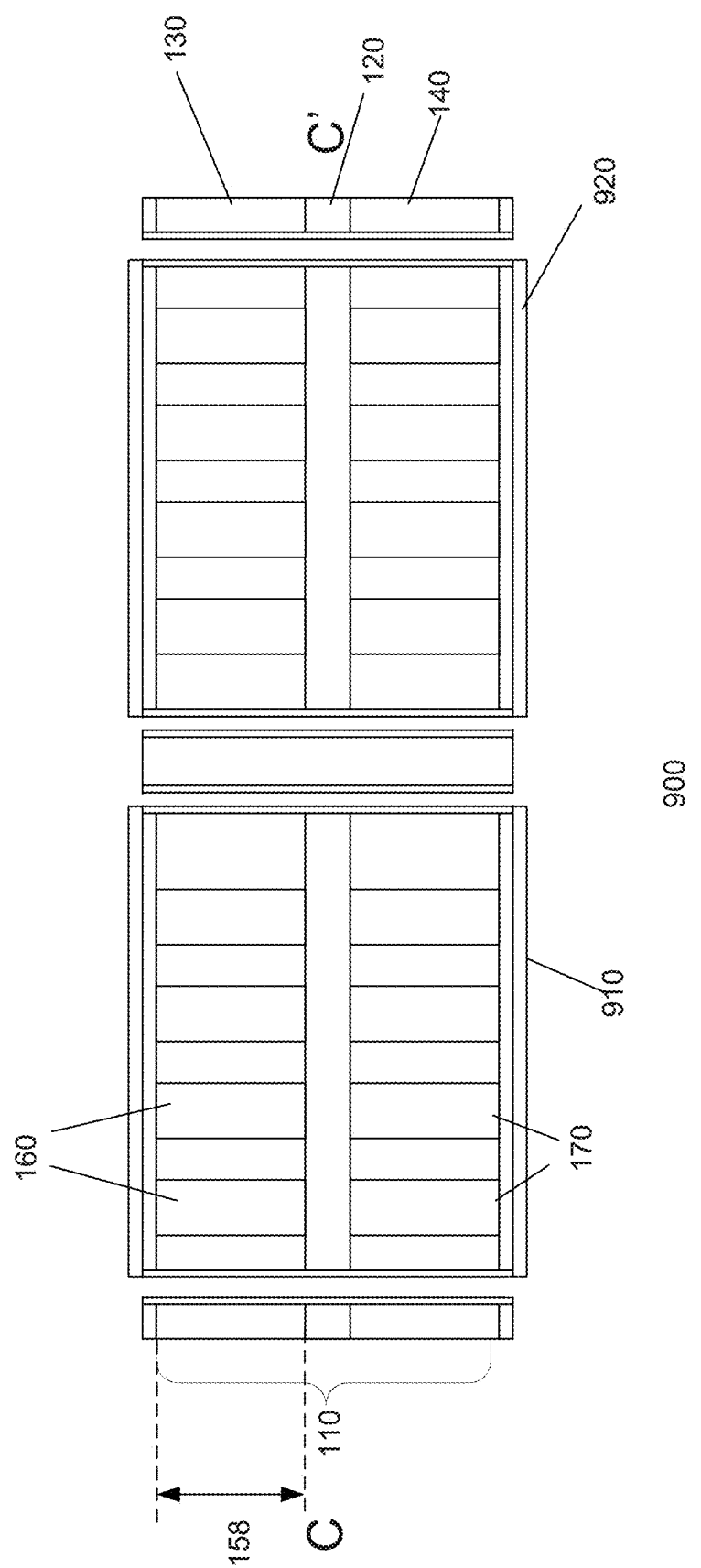

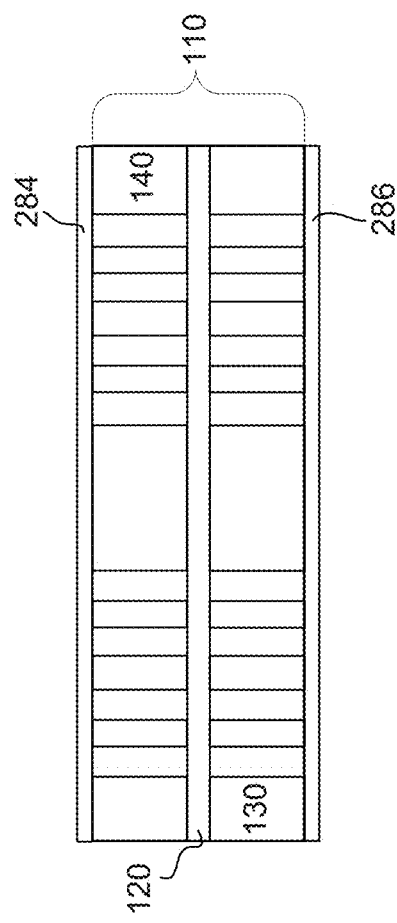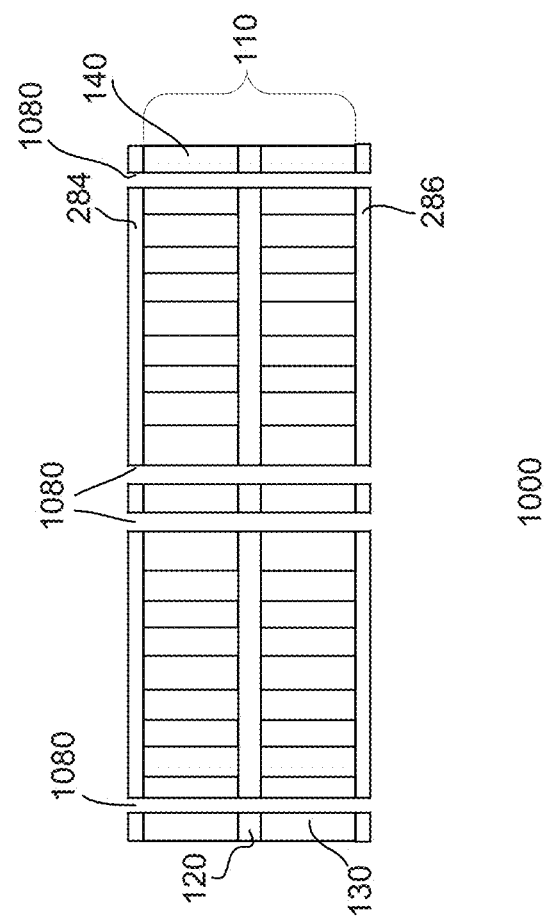
Fig. 10A
Fig. 10B

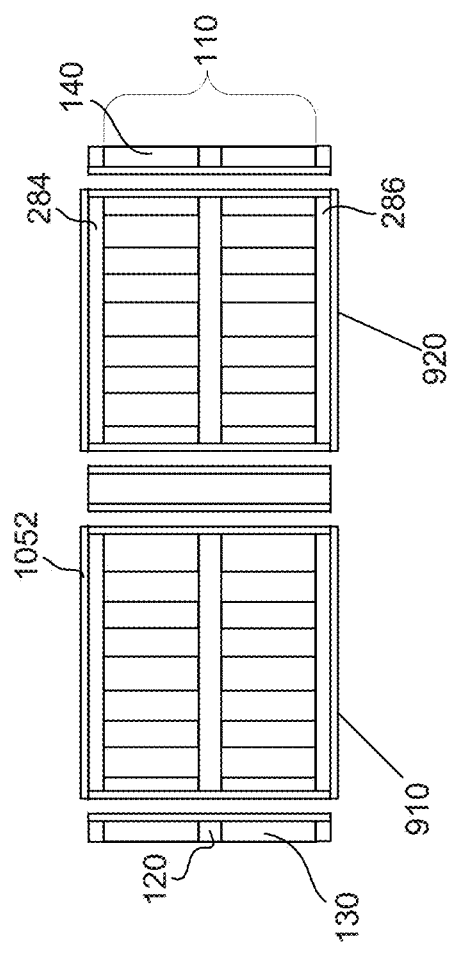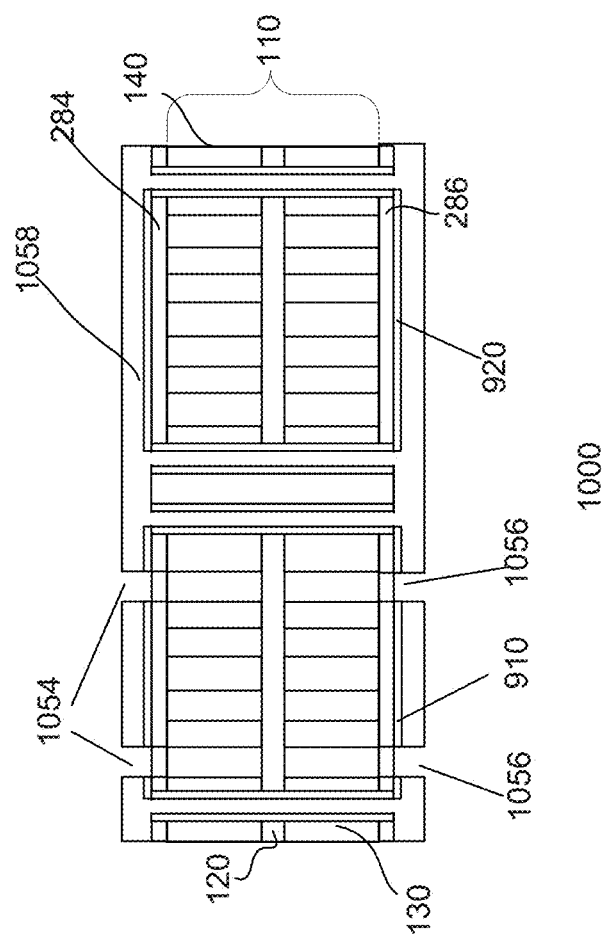

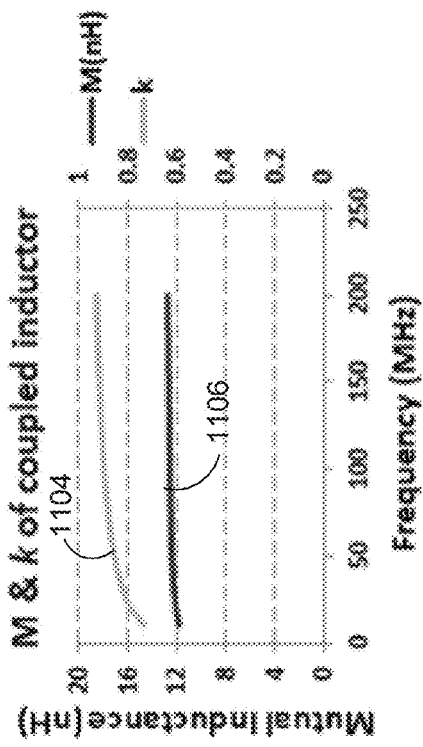
Fig. 11A
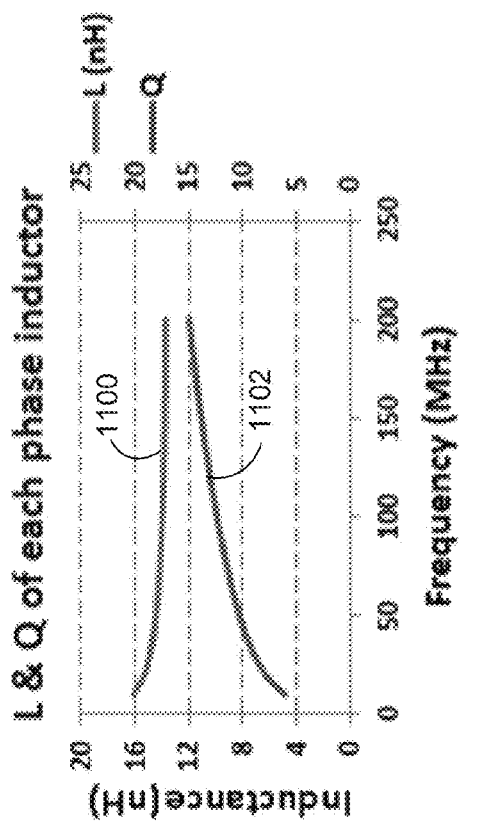
Fig. 11B
| Specification | Target | Device 100 | Device 500 | Device 900 |
|---|---|---|---|---|
| DC resistance | 50 mΩ | 92.5 mΩ | 92.5 mΩ | 92.5 mΩ |
| DC Inductance | 5 nH | 9 nH | 10.8 nH | 16.1 nH |
| FOM(DC): L/RDCnH/mΩ | 0.1 | 0.097 | 0.117 | 0.174 |
| FOM(AC): Q-factor | NA | 14 | 6.8 | 13.8 |
| Efficiency ηL | 90% | 95.3% | 94.2% | 96.6% |
| EMI concern | NA | Yes | None | None |
1200
Fig. 12

HIGH VOLTAGE DEVICE

BACKGROUND

With continuous miniaturization and ever-increasing functionality of modern electronic devices, power electronic circuits, such as switched mode power supply (SMPS), or integrated voltage regulator (IVR), are required to minimize power consumption, and hence increase battery lifetime within a compact size. However, the performance advancement is often limited by the magnetically induction devices, such as inductor or transformer, which either has a poor power efficiency (leading to short battery lifetime) or occupies a large chip area (leading to bulky size). This is especially true in mobile devices, such as smartphones, tablets, digital cameras, and gaming consoles.

From an electrical circuit point of view, it may be preferred to use two phase power converter designs based on coupled-inductors compared to a single-phase buck converter type design to improve power conversion efficiency. However, use of coupled-inductors may lead to substantial increases in chip footprint area.

From the foregoing discussion, it is desirable to provide tools and techniques to develop and fabricate monolithically compact coupled-inductors with a high power conversion efficiency.

SUMMARY

Embodiments generally relate to devices and methods of forming a semiconductor device. In one embodiment, a method of forming a device is presented. The method includes providing a wafer that includes a center insulator layer sandwiched by a top substrate and a bottom substrate. Both sides of the wafer are patterned and etched in sequence to form deep trenches in both substrates. A conductive seed layer is formed on both sides of the wafer in sequence to cover all exposed areas. Both sides of the wafer are electroplated simultaneously to fill both deep trenches with a conductive material. Both sides of the wafer are polished in sequence to form a coplanar surface. A protective layer is deposited on both sides of the wafer in sequence. Selective portions of the protective layer on both sides are patterned and etched in sequence to expose micro bump bonding areas. Micro bumps are formed on both sides of the wafer in sequence to facilitate electrical connection with other circuits packaged in a stacked chip arrangement.

In yet another embodiment, a device is disclosed. The device is a two phase air core coupled inductor that includes a top inductor embedded in a top substrate and a bottom inductor embedded in a bottom substrate. A center insulator layer is sandwiched by the top substrate and the bottom substrate. The top inductor is configured to be magnetically coupled across the center insulator layer to the bottom inductor. Further, the top inductor is substantially identical to the bottom inductor with the top inductor and the bottom inductor being symmetrically disposed on either side of the center insulator layer as mirror images.

In yet another embodiment, another device is disclosed. The device is a two phase magnetic core coupled inductor that includes a top inductor embedded in a top substrate and a bottom inductor embedded in a bottom substrate. A center insulator layer is sandwiched by the top substrate and the bottom substrate. The device also includes a top magnetic core disposed on a top surface of the top substrate and a bottom magnetic core disposed on a bottom surface of the bottom substrate. The top substrate, the center insulator layer and the bottom substrate are sandwiched by the top magnetic core and the bottom magnetic core.

In yet another embodiment, another device is disclosed. The device is a two phase closed-loop magnetic core coupled inductor that includes a top inductor embedded in a top substrate and a bottom inductor embedded in a bottom substrate. A center insulator layer is sandwiched by the top substrate and the bottom substrate. The device also includes a first closed-loop magnetic core disposed by wrapping a first portion of the top inductor, the center insulator layer and the bottom inductor with a ferromagnetic material, where the first closed-loop magnetic core is in the form of a rectangular sleeve. The device also includes a second closed-loop magnetic core disposed by wrapping a second portion of the top inductor, the center insulator layer and the bottom inductor with a ferromagnetic material, where the second closed-loop magnetic core is in the form of a rectangular sleeve.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which:

FIG. 1B shows a cross-sectional view of an embodiment of a portion of a two phase air core coupled inductor.

FIG. 4 illustrates in tabular form a table that compares the performance metrics of a two phase air core coupled inductor.

FIG. 5A shows a simplified isometric view of an embodiment of a portion of a two phase magnetic core coupled inductor.

FIGS. 6A-6D show an embodiment of a process to fabricate a portion of a two phase magnetic core coupled inductor.

FIGS. 7A and 7B are graphical plots illustrating simulated performance of a two phase magnetic core coupled device as a function of frequency.

FIG. 8 illustrates in tabular form a table that compares the performance metrics of a two phase magnetic core coupled device.

FIG. 9B shows a cross-sectional view of an embodiment of a portion of a two phase closed-loop magnetic core coupled inductor.

FIGS. 10A-10E show an embodiment of a process to fabricate a portion of a two phase closed-loop magnetic core coupled inductor.

FIGS. 11A and 11B are graphical plots illustrating simulated performance of a two phase closed-loop magnetic core coupled device as a function of frequency.

FIG. 12 illustrates in tabular form a comparison table that compares the performance metrics of the two phase air core coupled inductor, the two phase magnetic core coupled inductor and the two phase closed-loop magnetic core coupled inductor.

DETAILED DESCRIPTION

Embodiments generally relate to devices, such as semiconductor devices or ICs. Other types of devices may also be useful. The devices can be any type of IC, for example, power management IC, gate driver IC, and/or microprocessor. Further, the devices can be configured as a system-on-chip (SOC), or a system-in-package (SIP), or even stacked chips in a 2.5D or 3D architecture. Further, the devices can be incorporated into, for example, consumer electronic products, such as computers, cell phones, and handheld electronic devices. Incorporating the devices in other suitable applications may also be useful.

In order to improve power conversion efficiency of electrical circuits, it may be preferred to use two phase power converter based on coupled-inductor compared to single phase inductor based design (e.g., single-phase buck converter). It is because the current in each phase is driven 180 degrees apart from each other. Thus, current ripple in the output may be completely cancelled. It decreases inductor losses and hence improves power conversion efficiency compared to the single phase design. However, the number of required inductors is doubled compared to the single phase design, which leads to twice the footprint area. Moreover, the coupling coefficient in the coupled-inductor may still need improvement since the two phase inductors are usually placed side by side on the wafer surface. On the other hand, from a device point of view, in order to further decrease inductor loss and thus increase power conversion efficiency, cross-sectional area of inductor winding is usually increased to provide small DC resistance and thus large inductance/DC resistance ratio. However, increasing cross-sectional area is usually implemented by increasing metal winding width, which leads to a large footprint area as well. Various embodiments in this disclosure describe tools and techniques to develop and fabricate monolithically compact coupled-inductors with a high power conversion efficiency and improved magnetic coupling.

Figure 1A:
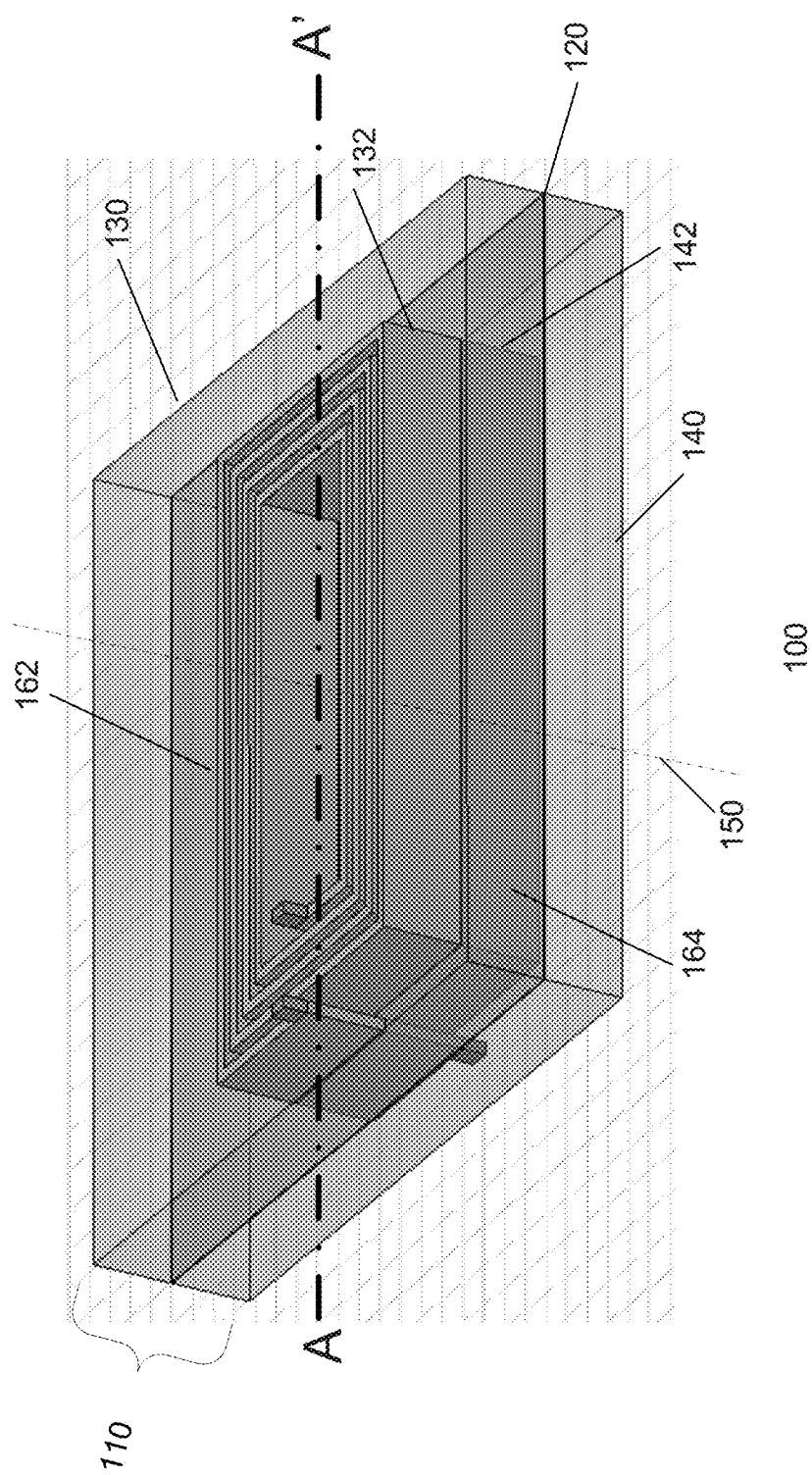
FIG. 1A shows a simplified isometric view of an embodiment of a portion of a two phase air core coupled inductor.

FIG. 1A shows a simplified isometric view of an embodiment of a portion of a two phase air core coupled inductor 100. FIG. 1B shows a cross-sectional view of an embodiment of a portion of the two phase air core coupled inductor 100. Referring to FIGS. 1A and 1B, the portion of the device includes a wafer 110 having a center insulator layer 120 sandwiched by a top substrate 130 and a bottom substrate 140. The top and bottom substrates, for example, may be a semiconductor substrate, such as a silicon substrate. Other suitable types of substrates, such as silicon germanium, are also useful. The center insulator layer may be fabricated from an insulator or a dielectric material such as silicon oxide. Other suitable types of insulator materials for fabricating the center insulator layer may also be useful.

In one embodiment, the wafer 110 may be purchased as a commercially available crystalline-on-insulator (COI) substrate product, such as silicon-on-insulator (SOI) substrate product, which is provided by a wafer manufacturer or produced by a device manufacturer. The wafer 110 is prefabricated with the top and bottom substrates having a configurable thickness (e.g., 50 to 150 µm each) and separated by the center insulator layer having a configurable thickness (e.g., 1 to 5 µm). Other suitable thickness ranges may also be useful. A plurality of devices (not shown) may be formed in parallel on the wafer. After the wafer has finished processing, it may be diced to singulate the devices.

In one embodiment, a top inductor 132 is embedded in the top substrate and a bottom inductor 142 is embedded in the bottom substrate. The shape of both top and bottom inductors is rectangular spiral. Other shapes such as circular spiral or racetrack shaped spiral may also be useful. The top and bottom inductors are symmetrically disposed on opposed sides of the center insulator layer. As a result, the device 100 occupies the same footprint area as a single phase counterpart. Further, in the depicted embodiment, the device 100 provides two phase air core based magnetic coupling between the top and bottom inductors. As described herein, air core based magnetic coupling refers to magnetic coupling that is achieved across non-magnetic materials, for example, silicon oxide or silicon, between two inductors. The permeability of non-magnetic materials is the same with that of air space.

In many power management IC applications such as switched mode power supply (SMPS), or integrated voltage regulators (IVR), two phase coupled inductor based power conversion circuits may be preferred compared to single phase inductor based designs. In a two phase power converter design, it is well known that the current in each phase is driven 180 degrees apart from each other. Thus, current ripple in the output may be offset in a two phase design to decrease inductor losses and improve power conversion efficiency compared to the single phase design. Due to process variations, the top inductor may not be exactly identical to the bottom inductor but the two inductors are substantially matched and properly aligned for improved magnetic coupling. Additional details of a process to fabricate the two phase air core magnetically coupled inductor 100 are described with reference to FIGS. 2A-2R which will be described later.

In the depicted embodiment, a portion of the top substrate is removed to form a top deep trench spiral 160. In one embodiment, a height (or depth) 158 of the top deep trench spiral may be configured to be equal to the thickness of the top substrate. In doing so, the cross-sectional area is increased to the largest extent, which leads to small DC resistance, but does not occupy large footprint area. The top deep trench spiral has, for example, a rectangular cross section. An aspect ratio of the top deep trench spiral, defined as height (or depth) divided by width of the rectangular cross section, is approximately equal to 7:1. Any other suitable aspect ratio (e.g., 3:1 to 10:1) which does not affect yield and quality of the product may also be useful. In one embodiment, the height and width of the rectangular cross section of the top deep trench spiral are configured to be about 100 µm and 15 µm respectively. The spacing between adjacent turns of the spirals equal to the width of the rectangular cross section, which is 15 µm. Other suitable height, width, and spacing dimensions may also be useful.

In one embodiment, the top inductor is fabricated from a conductive material being deposited to fill the top deep trench spiral. For illustration purpose, the top deep trench spiral is configured as a top spiral inductor 162, which includes N=4 turns, where N may be any integer greater than one. The $N^{th}$ turn is offset from the $(N-1)^{th}$ turn by a configurable distance, which may be configured to be the same as the width of the top deep trench. It is understood that the value of N depends on the requirement of device performance such as inductance, DC resistance, and quality factor, which may be configured to be application specific. In the depicted embodiment, the top spiral inductor 162 having 4 turns is configured to have a length of approximately 800 μm, a width of approximately 400 μm and a depth of approximately 100 μm. Other suitable length, width and thickness dimensions may also be useful.

The conductive material may be any metal or alloy. For example, the conductive material may be copper, aluminum, tungsten, their alloys, or a combination thereof. Other suitable types of conductive materials may also be useful. Interconnects, bonding areas, conductive seed layers, contact pads, and contacts may be formed of the same or similar type of materials. Forming interconnects, bonding areas, conductive seed layers, contact pads and contacts using different types of conductive materials may also be useful. For example, the contacts may be tungsten while the bonding areas may be copper in some applications.

In one embodiment, to improve magnetic coupling between the two inductors when the inductors are energized, the top inductor and the bottom inductor are aligned along an axis 150 perpendicular to the center insulator layer, the top inductor and the bottom inductor are symmetrically disposed on either side of the center insulator layer as mirror images. Being substantially identical, the bottom inductor has the same set of features as the top inductor.

In the depicted embodiment, a portion of the bottom substrate is removed to form a bottom deep trench spiral 170. In one embodiment, a height of the bottom deep trench spiral may be configured to be equal to the thickness of the bottom substrate. In doing so, the cross-sectional area is increased to the largest extent, which leads to small DC resistance, but it does not occupy a large footprint area. The bottom deep trench spiral, for example, has a rectangular cross section. An aspect ratio of the bottom deep trench spiral, defined as height (or depth) divided by width of the rectangular cross section, is approximately equal to 7:1. Any other suitable aspect ratio (e.g., 3:1 to 10:1) which does not affect yield and quality of the product may also be useful. In one embodiment, the height and width of the rectangular cross section of the bottom deep trench spiral are configured to be about 100 μm and 15 μm respectively. The spacing between adjacent turns of the spiral is equal to the width of the rectangular cross section, which is 15 μm. Other suitable height, width, spacing dimensions may also be useful.

In one embodiment, the bottom inductor is fabricated from a conductive material being deposited to fill the bottom deep trench spiral. For illustration purpose, the bottom deep trench spiral is configured as a bottom spiral inductor 164, which includes N=4 turns, where N may be any integer greater than one. The $N^{th}$ turn is offset from the $(N-1)^{th}$ turn by a configurable distance, which may be configured to be the same as the width of the bottom deep trench. It is understood that the value of N depends on the requirement of device performance such as inductance, DC resistance, and quality factor, which may be configured to be application specific. In the depicted embodiment, the bottom spiral inductor 164 having 4 turns is configured to have a length of approximately 800 μm, a width of approximately 400 μm, a depth of approximately 100 μm. Other suitable length, width and thickness dimensions may also be useful.

Figure 2C:
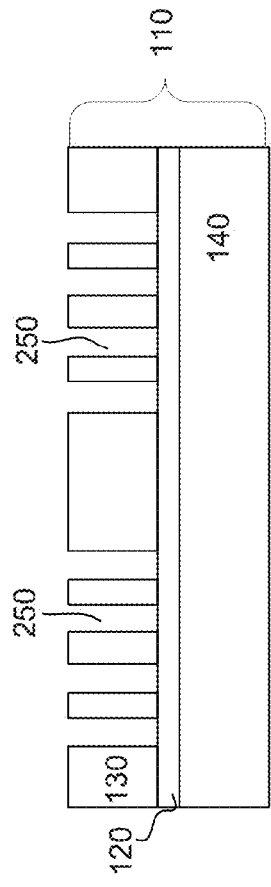
FIGS. 2A-2R show an embodiment of a process to fabricate a portion of a two phase air core coupled inductor.
Figure 2D:
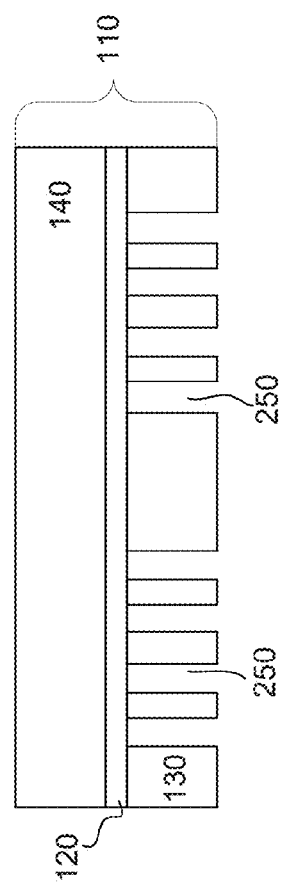
Figure 2E:
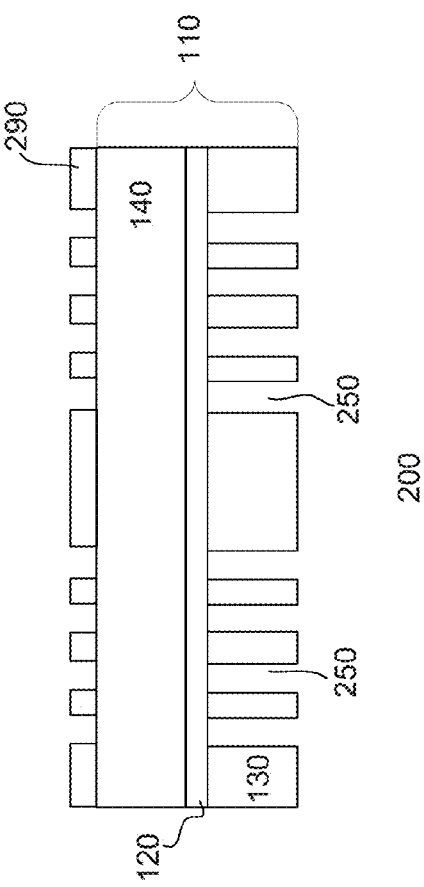
Figure 2F:
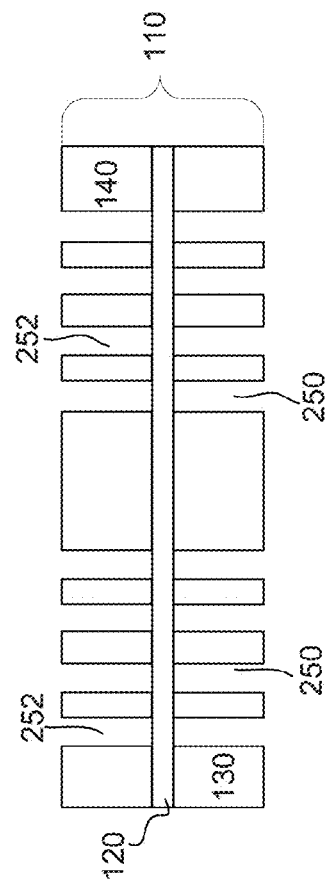
Figure 2G:
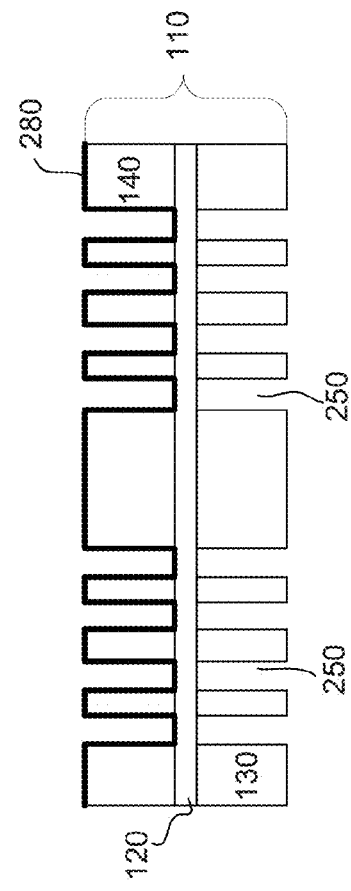
Figure 2H:
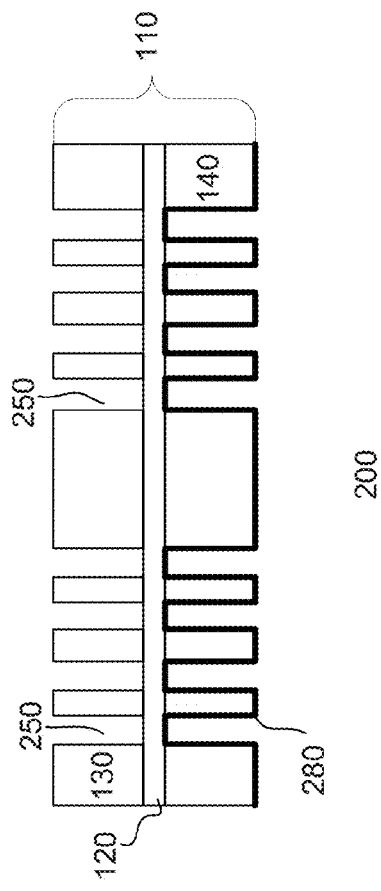
Figure 2O:
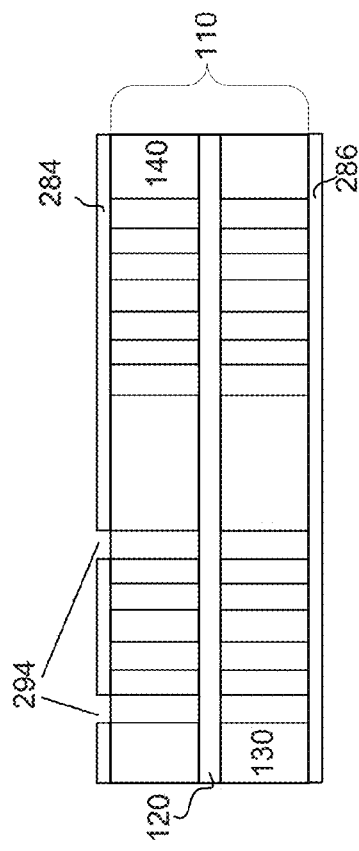
Figure 2P:
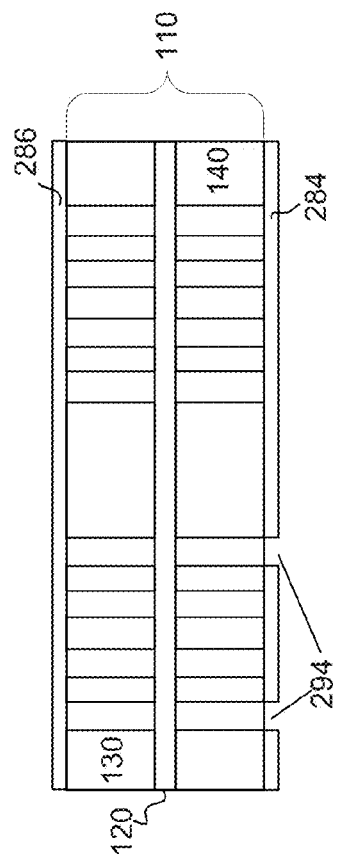
Figure 2Q:
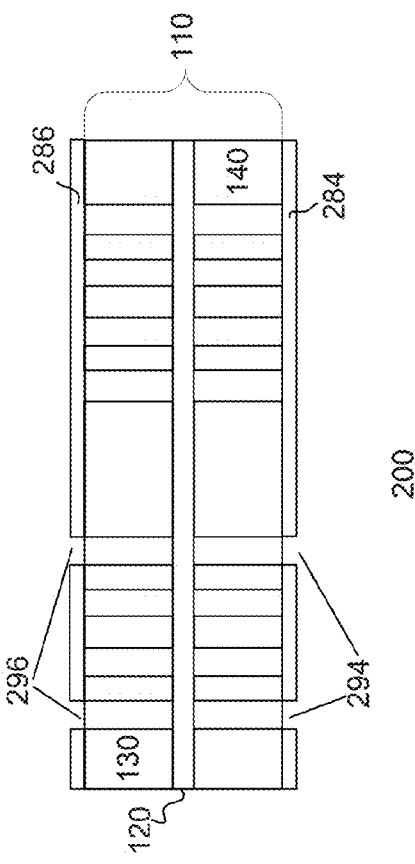
Figure 2R:
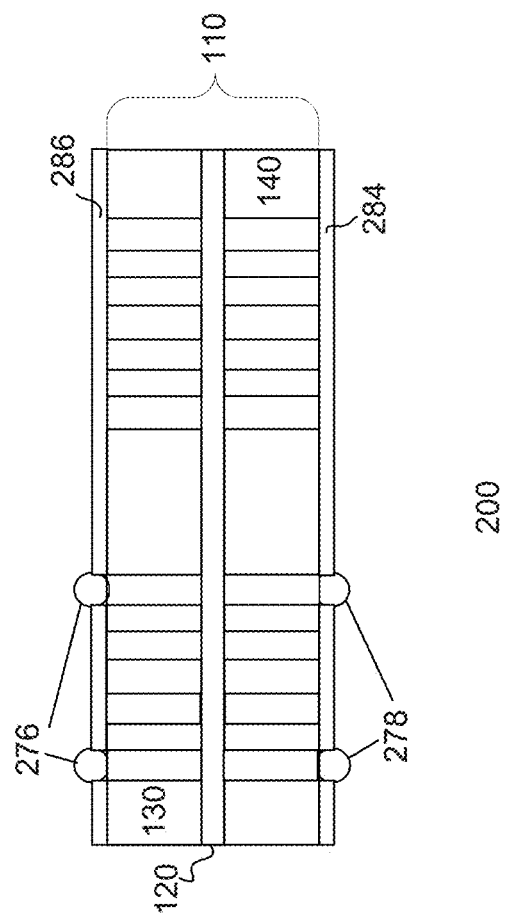

FIGS. 2A-2R show an embodiment of a process 200 to fabricate the two phase air-core coupled-inductor 100. As described herein, process 200 may include several unit operations that may be performed in a configured sequence to fabricate a device such as the device 100. Examples of unit operations may include but are not limited to operations such as polishing, patterning, etching, deposition, and others.

Polishing is a chemical/mechanical process (CMP) that planarizes the uneven surface and makes the wafer flat and smooth enough to support optical photolithography. Patterning is the shaping or altering of deposited materials and etching is a process that removes material from the wafer. Deposition generally refers to any process that grows, coats, or otherwise transfers a material onto the wafer. There may be several choices of processes for metal deposition such as screen-printing, sputtering, electroplating, and others. Selection of a particular process is typically application dependent. Screen-printing may be preferred for large feature size. Sputtering may be suitable for deep trenches with good coverage. Electroplating may be suitable since it is fast to deposit, may be suitable for deep trenches, and may be deposited on both sides of a wafer simultaneously.

The process 200 begins by having two insulator layers of two silicon substrates bonded and etched by suitable processes to produce the wafer 110 having the top and bottom substrates 130 and 140 separated by the center insulator layer 120 as shown in FIG. 2A. As described earlier, the wafer 110 may also be purchased as a commercially available prefabricated product with the top and bottom substrates having a configurable thickness (e.g., 50 to 150 μm each) and separated by the center insulator layer having a configurable thickness (e.g., 1 to 5 μm). Other suitable thickness ranges may also be useful.

Referring to FIG. 2B, the process 200 continues in which a photo resist 290 is applied to the top substrate to define a spiral pattern arrangement for fabricating a top trench. As shown in FIG. 2C, a portion of the top substrate is removed (e.g., by using an etching process) to form the top trench 250 disposed along a direction perpendicular to the center insulator layer. The etching process, for example, may be an anisotropic etch, such as deep reactive ion etch (DRIE). Other suitable removal process may also be employed. The wafer 110 is flipped (or turned over) to swap relative positions of the top substrate and the bottom substrate as shown in FIG. 2D.

In FIG. 2E, a photo resist 290 is applied to the bottom substrate to define a spiral pattern arrangement for fabricating the bottom trench. A portion of the bottom substrate is removed (e.g., by using an etching process) to form the bottom trench 252 disposed along a direction perpendicular to the center insulator layer as shown in FIG. 2F. The process continues by depositing a bottom conductive seed layer 280 (e.g., by using sputtering process) on exposed portions of the bottom substrate, the center insulator layer and the bottom trench respectively as shown in FIG. 2G. Other suitable deposition techniques may be employed.

The wafer is flipped to swap relative positions of the top substrate and the bottom substrate as shown in FIG. 2H. Referring to FIG. 2I, a top conductive seed layer 282 is deposited (e.g., by using sputtering process) on exposed portions of the top substrate, the center insulator layer and the top trench respectively. Other suitable deposition techniques may be employed. As shown in FIG. 2J, a conductive material 260 is simultaneously deposited (using an electroplating process) on the top conductive seed layer and the bottom conductive seed layer and fill the top and bottom trenches of the wafer 110. Other suitable deposition techniques which can simultaneously fill the top and bottom trenches may also be useful.

Referring to FIG. 2K, the top surface of the top substrate is polished (e.g., using a Chemical Mechanical Polishing/Planarization (CMP) process) to remove a portion of the conductive layer deposited above the top surface of the top substrate. A planarizing process, such as the CMP, may be performed to remove excess conductive material and to provide a co-planar surface with the top substrate and top surface of the deep trenches filled with the conductive material to form a top spiral inductor 162. The wafer is flipped to swap relative positions of the top substrate and the bottom substrate as shown in FIG. 2L. The top surface of the bottom substrate is polished (e.g., using a Chemical Mechanical Polishing/Planarization (CMP) process) to remove portion of the conductive layer deposited above the top surface of the bottom substrate to form a bottom spiral conductor 164 as shown in FIG. 2M. Other suitable planarization techniques may also be employed.

In FIG. 2N, a protective layer 284 is formed on the top surface of the substrate 140 and a protective layer 286 is formed on the top surface of the substrate 130 (e.g., by using a Chemical Vapor Deposition (CVD) technique). For example, the protective layers are formed using high density plasma CVD technique. Other suitable deposition technique may also be useful. The protective layers 284, 286 may be fabricated from silicon dioxide or silicon nitride type dielectric materials. Other suitable dielectric materials may also be useful.

Referring to FIG. 2O, portions of the protective layer 284 are patterned and etched to access micro bump bonding areas 294 on the protective layer to couple the spiral inductor. Patterning is the shaping or altering of deposited materials and etching is a process that removes material from the wafer. The wafer is flipped to swap relative positions of the top substrate and the bottom substrate as shown in FIG. 2P. Portions of the protective layer 286 are patterned and etched to access micro bump bonding areas 296 on the protective layer to couple the spiral inductor as shown in FIG. 2Q.

Referring to FIG. 2R, a conductive material is used to form top and bottom micro bumps 276, 278 in the top micro bump bonding area and the bottom micro bump bonding area respectively. The conductive micro bumps may be fabricated by using a metal electroplating process. For example, the conductive micro bumps may be formed using electrochemical plating process. Other suitable techniques may be employed to form the micro bumps.

The conductive micro bumps may also be referred to as contacts. The bonding areas may also be referred to as contact pads to facilitate stacking. For example, another device (not shown) may be stacked over the device 100. It is contemplated that the top and bottom micro bumps in the top micro bump bonding area and the bottom micro bump bonding area may be used to couple the device 100 with other devices (not shown) in stacked chip structures such as 2.5D and 3D designs. For example, the device 100 may be used as a silicon interposer (SI) in 2.5D integrated chip designs.

Figure 3A:
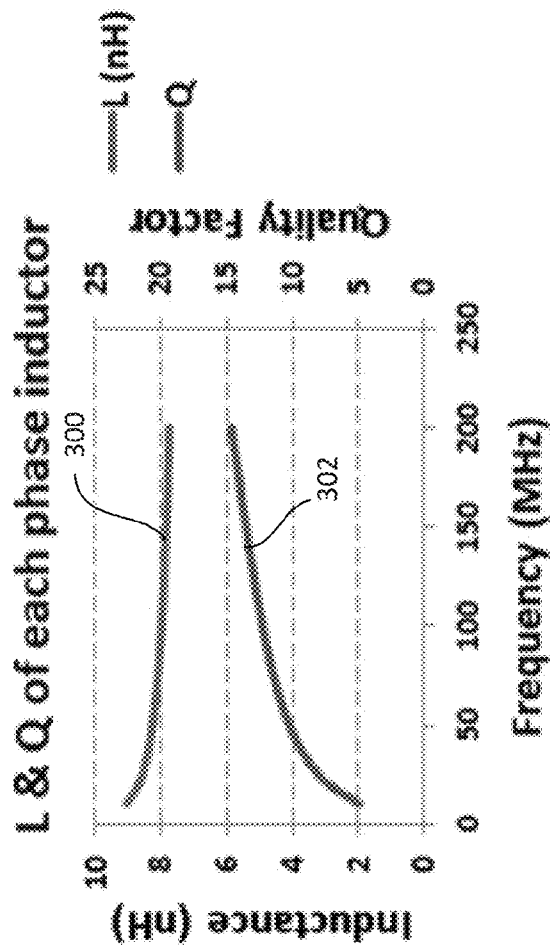
FIGS. 3A-3B show graphical plots illustrating simulated performance of a two phase air core coupled device as a function of frequency.
Figure 3B:
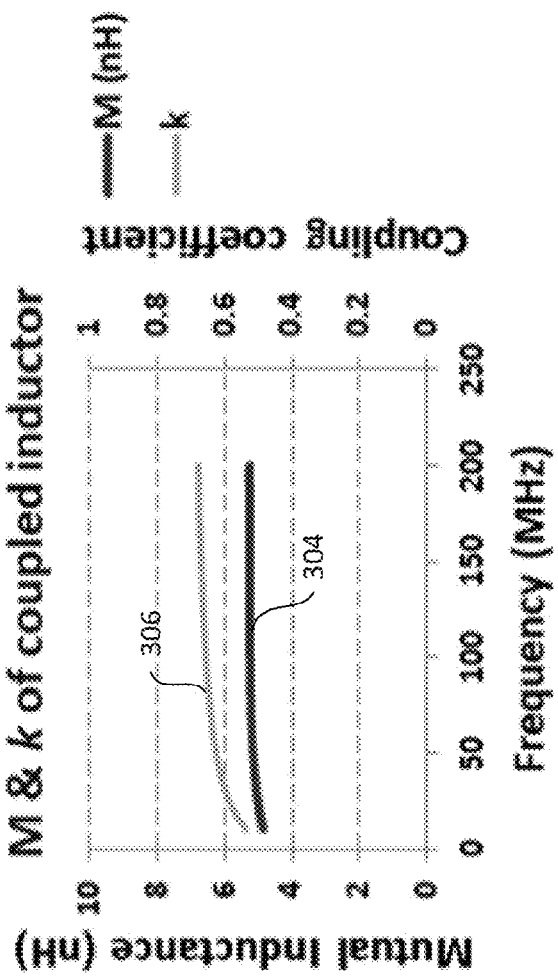

FIGS. 3A and 3B are graphical plots illustrating simulated performance of the two phase magnetic air core coupled device 100 as a function of frequency. In one embodiment, simulated values for the performance of the two phase magnetic air core coupled device 100 are computed by using HFSS (High Frequency Structure Simulator) simulation tool/software for passive devices.

Referring to FIG. 3A, graphical plots 300, 302 illustrate inductance value (Y1-axis) and Quality (Q) factor (Y2-axis) of each phase inductor (top and bottom) respectively measured over a range of frequencies (X-axis). Inductance values greater than 7.8 nH are achieved between the frequency range of approximately 10 MHz to approximately 170 MHz. Ratio of inductance value per unit area (measure of inductance density) is greater than 24 nH/mm2. A Q-factor of about 14 is achieved at a frequency of about 170 MHz. DC resistance of the inductor (RDC) is approximately equal to 92.5 mΩ due to the large winding thickness of 100 μm.

Referring to FIG. 3B, graphical plots 304, 306 illustrate mutual inductance and coupling coefficient respectively of the coupled inductor (top and bottom pair). A mutual inductance value that is greater than 4.8 nH is achieved between the frequency range of approximately 10 MHz to approximately 170 MHz and coupling coefficient of 0.67 is achieved at a frequency of about 170 MHz.

FIG. 4 illustrates in tabular form a Table 400 that compares the performance metrics of the two phase magnetic air core coupled device 100 relative to a target performance metrics. The device 100 exceeds virtually all performance metrics such as DC resistance, DC inductance, Q-factor, efficiency compared to the target. A technique described with reference to FIGS. 2A-2R to fabricate two phase magnetic air core coupled device 100 may also be more cost-effective because deep trenches are used to form the thick copper conductors that are often needed for high performance (compared to using plating techniques that require very thick copper layers).

Figure 5B:
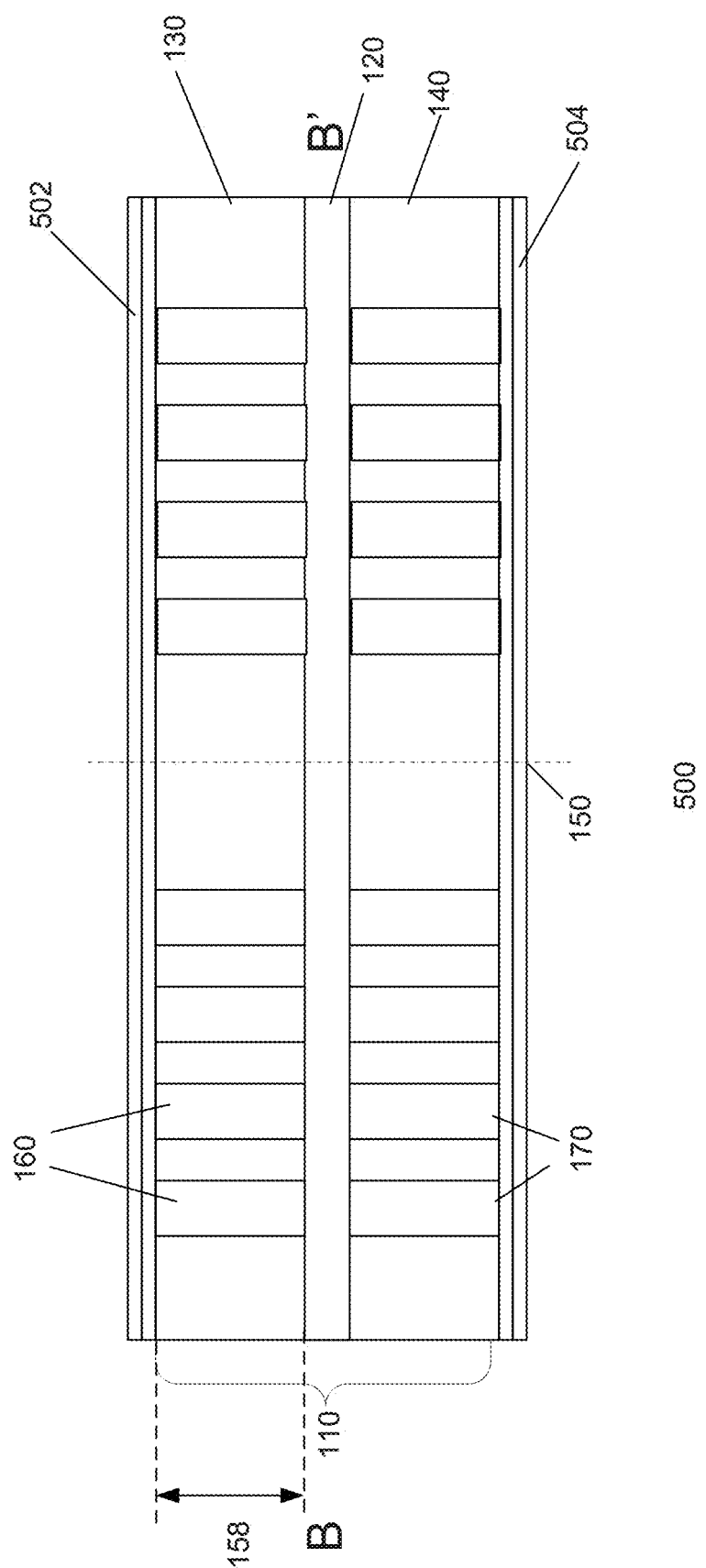
FIG. 5B shows a cross-sectional view of an embodiment of a portion of a two phase magnetic core coupled inductor.

FIG. 5A shows a simplified isometric view of an embodiment of a portion of a magnetic core coupled device 500. FIG. 5B shows a cross-sectional view of an embodiment of a portion of the magnetic core coupled device 500. The portion of the magnetic core coupled device 500 is similar to the portion of the air core coupled-inductor 100. As such, common elements or features will not be described or described in detail. Referring to FIGS. 5A and 5B, the device 500 is a two phase magnetic core coupled inductor. In order to further improve inductance density (as well as inductance/DC resistance ratio) and coupling coefficient performance metrics, the device 100 described with reference to FIGS. 1A and 1B, may be enhanced by adding a top magnetic core 502 and a bottom magnetic core 504 to the upper and lower surfaces of the top substrate and the bottom substrate respectively. In effect, other than bonding areas for the top and bottom inductors, the top magnetic core 502 and a bottom magnetic core 504 are configured to sandwich the device 100 described with reference to FIGS. 1A and 1B.

Referring back to FIGS. 5A and 5B, the top magnetic core 502 and the bottom magnetic core 504 are in the form of a magnetic plate. Both the top and bottom magnetic cores may be fabricated from a ferromagnetic material, such as iron (Fe), nickel (Ni), cobalt (Co). Incorporating other suitable types of insulating material, such as aluminum oxide (Al—O), can make granular magnetic film with high electric resistivity. High electric resistivity of ferromagnetic material may also be useful in other applications. The top and bottom magnetic cores 502, 504 provide electromagnetic interference (EMI) shielding for other devices (not shown) in applications that may use stacked chip structures such as 2.5D and 3D designs. Additional details of a process to fabricate the device 500 are described with reference to FIGS. 6A-6D.

FIGS. 6A-6D show an embodiment of a process 600 to fabricate a portion of a two phase magnetic core coupled inductor, e.g., the device 500. The process 600 is similar to the process 200 as described in FIGS. 2A-2R. As such, common features or elements will not be described or described in detail.

Referring to FIG. 6A, a partially processed wafer is provided. The wafer is processed up to the stage as described in FIG. 2N. For example, top and bottom spiral inductors are formed in the top and bottom substrate; while top surfaces of the top and bottom substrates are provided with protective layers. Referring to FIG. 6B, process 600 continues to form a magnetic core 504 on the top surface of the protective layer 284 and a magnetic core 502 is formed on the surface of the protective layer 286. The magnetic cores 502, 504 may be simultaneously fabricated from a ferromagnetic material, such as a combination of iron (Fe), nickel (Ni), cobalt (Co) and aluminum oxide (Al—O), using a sputtering process. Other suitable types of ferromagnetic material and techniques may also be employed.

Referring to FIG. 6B, a second protective layer 684 is formed on the top surface of the magnetic core 504 and a second protective layer 686 is formed on the surface of the magnetic core 502. The protective layers 684, 686 may be fabricated from silicon dioxide or silicon nitride type dielectric materials to protect the magnetic cores. The second protective layers may be formed using CVD. Other suitable dielectric materials and techniques may also be used.

Portions of the protective layer, top magnetic core and second top protective layer of the substrate 140 are patterned and etched to gain access to top micro bump bonding areas on the top protective layer to couple the spiral inductor 164. The wafer is flipped to swap relative positions of the top substrate and the bottom substrate. Portions of the protective layer, the magnetic core and second protective layer of the substrate 130 are patterned and etched to gain access to the micro bump bonding areas on the protective layer to couple the spiral inductor 162 as shown in FIG. 6C.

Referring to FIG. 6D, conductive material, such as a combination of nickel (Ni) and gold (Au), is used to form top and bottom micro bumps 676, 678 in the top micro bump bonding area and the bottom micro bump bonding area respectively. The conductive micro bumps may be fabricated by using a metal electroplating process. Other suitable types of conductive material and techniques may also be employed.

It is contemplated that the top and bottom micro bumps 676, 678 in the top micro bump bonding area and the bottom micro bump bonding area may be used to couple the device 500 with other devices (not shown) in stacked chip structures such as 2.5D and 3D designs. For example, the device 500 may be used as a silicon interposer (SI) in 2.5D integrated chip design.

FIGS. 7A and 7B are graphical plots illustrating simulated performance of the magnetic core coupled device 500 as a function of frequency. In one embodiment, simulated values for the performance of the device 500 are computed by using HFSS (High Frequency Structure Simulator) simulation tool/software for passive devices.

Referring to FIG. 7A, graphical plots 700, 702 illustrate inductance value (Y1-axis) and Quality (Q) factor (Y2-axis) of each phase inductor (top and bottom) respectively measured over a range of frequencies (X-axis). Inductance values greater than 10.8 nH are achieved between the frequency range of approximately 10 MHz to approximately 170 MHz. Ratio of inductance value per unit area (measure of inductance density) is greater than 26 nH/mm². A Q-factor of about 6.8 is achieved at a frequency of about 170 MHz. DC resistance of the inductor (RDC) is approximately equal to 92.5 mΩ due to the large winding thickness of 100 μm.

Referring to FIG. 7B, graphical plots 704, 706 illustrate mutual inductance and coupling coefficient respectively of the coupled inductor (top and bottom pair). A mutual inductance value that is greater than 6.9 nH is achieved between the frequency range of approximately 10 MHz to approximately 170 MHz and coupling coefficient of 0.87 is achieved at a frequency of about 200 MHz.

FIG. 8 illustrates in tabular form a table 800 that compares the performance metrics of a magnetic core coupled device relative to a target performance metrics. The device 500 exceeds virtually all performance metrics such as DC resistance, DC inductance, Q-factor, efficiency compared to the target. A technique described with reference to FIGS. 6A-6D to fabricate device 500 is potentially more cost-effective because deep trenches are used to form the thick copper conductors needed for high performance (rather than plating very thick copper layers).

Figure 9A:
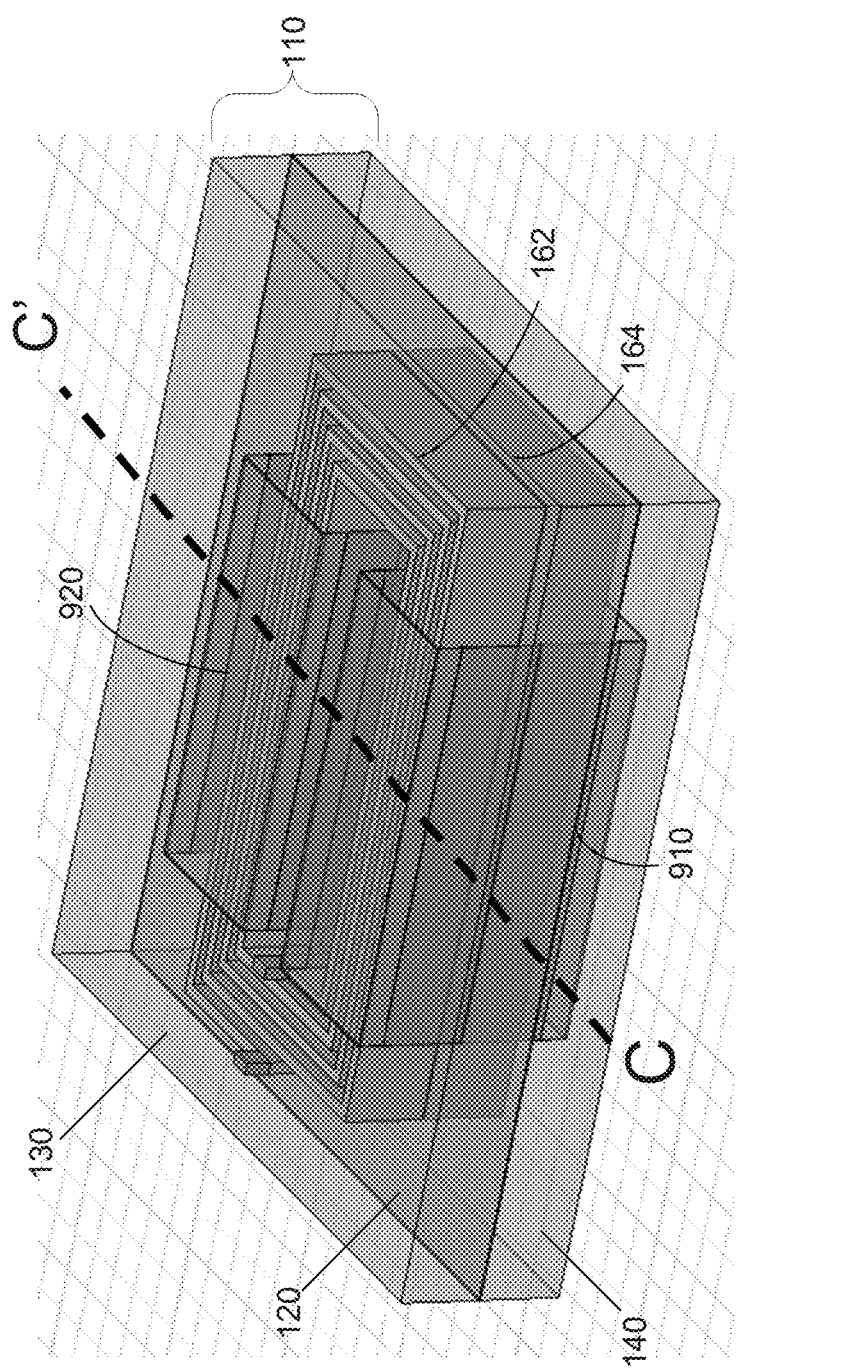
FIG. 9A shows a simplified isometric view of an embodiment of a portion of a two phase closed-loop magnetic core coupled inductor.

FIG. 9A shows a simplified isometric view of an embodiment of a portion of a two phase closed-loop magnetic core coupled device 900. FIG. 9B shows a cross-sectional view of an embodiment of a portion of the two phase closed-loop magnetic core coupled device 900. Referring to FIGS. 9A and 9B, the device 900 is a two phase closed-loop magnetic core coupled inductor. In order to limit electromagnetic interference caused by energizing the top inductor and the bottom inductor, and to further improve inductance density and coupling coefficient performance metrics, the device 100 described with reference to FIGS. 1A and 1B, may be enhanced by wrapping a first portion of the top inductor, the center insulator layer and the bottom inductor with a ferromagnetic material to form a first closed-loop magnetic core 910 and a second portion of the top inductor, the center insulator layer and the bottom inductor is wrapped by the ferromagnetic material to form a second closed-loop magnetic core 920. For example, the ferromagnetic material may include a combination of iron (Fe), nickel (Ni), cobalt (Co) and aluminum oxide (Al—O). Incorporating other suitable types of ferromagnetic materials may also be useful in other applications. The first and second closed-loop magnetic cores 910, 920 may be implemented in the form of an open ended rectangular sleeve.

In the depicted embodiment, the first and second closed-loop magnetic cores 910, 920 may include the longer side or dimension of the top and bottom spiral inductors 162, 164, which include, for example, N=4 turns. In doing so, uniaxial anisotropy of the magnetic material can be employed, which makes magnetic flux to travel along the hard axis rather than easy axis during inductor operation. Hence, core loss can be reduced at a high frequency. Further, as described with reference to FIGS. 1A and 1B, the longer dimension of the top spiral inductor 162 is approximately 800 μm compared to a width of approximately 400 μm and a depth of approximately 100 μm. Referring back to FIGS. 9A and 9B, the magnetic flux within device 900 is concentrated in the closed-loop magnetic core thereby enhancing the inductance density. Additional details of a process to fabricate the device 900 are described with reference to FIGS. 10A-10F and additional details of a comparison table that compares the performance metrics of the devices 100, 500 and 900 is described with reference to FIG. 12.

FIGS. 10A-10E show an embodiment of a process 1000 to fabricate a portion of a two phase closed-loop magnetic core coupled inductor, e.g., the device 900. The process 1000 is similar to the process 200 described with reference to FIGS. 2A-2R. As such, common elements or features will not be described or described in detail.

Referring to FIG. 10A, a partially processed wafer is provided. The wafer is processed up to the stage as described in FIG. 2N. For example, top and bottom spiral inductors are formed in the top and bottom substrate and top surfaces of the top and bottom substrates are provided with protective layers. As shown in FIG. 10B, the process 1000 continues in which portions of the protective layer, the top substrate, the center insulator layer, the bottom substrate, and the protective layer are patterned and etched to form, for example, 4 trenches 1080 used to accommodate the first and second closed-loop magnetic cores 910, 920. Position of each one of the 4 trenches 1080 is configured to facilitate the fabrication of the first and second closed-loop magnetic cores 910, 920. Other suitable number of trenches may also be useful. The trenches, for example, may be formed by DRIE. Other suitable techniques which can form deep trenches may also be useful.

Figure 10E:
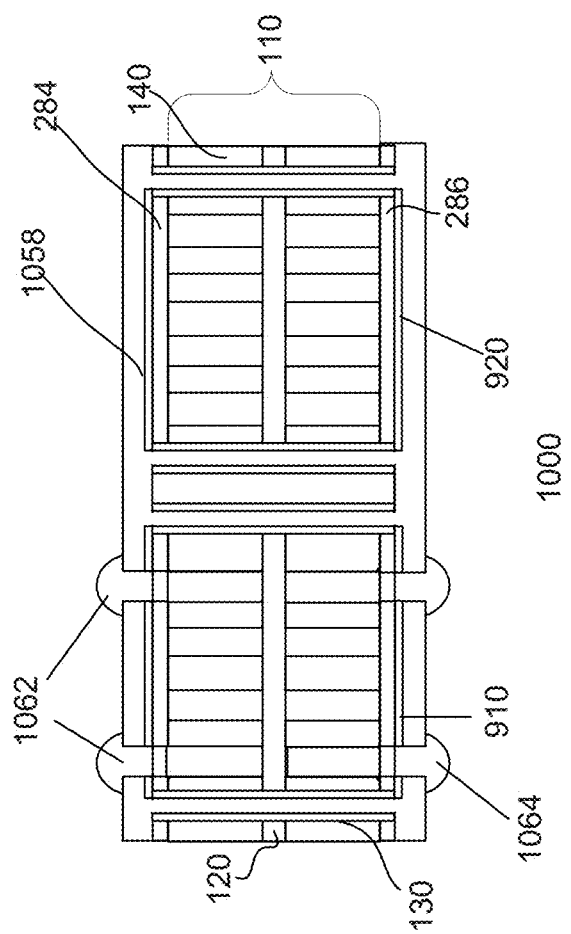

Magnetic material 1052 is deposited (e.g., by a sputtering process), patterned and etched to wrap the inductors and the center insulator layer to form first and second closed-loop magnetic cores 910, 920 as shown in FIG. 10C. Referring to FIG. 10D, a protective layer 1058 (e.g., using polyimide material) is filled, patterned and etched to gain access to a top and bottom micro bump bonding areas 1054, 1056 respectively. As shown in FIG. 10E, a conductive material is used to form top and bottom micro bumps 1062, 1064 in the top micro bump bonding area and the bottom micro bump bonding area respectively. The conductive micro bumps may be fabricated by using a metal electroplating process.

It is contemplated that the top and bottom micro bumps 1062, 1064 in the top micro bump bonding area and the bottom micro bump bonding area may be used to couple the device 1000 with other devices (not shown) in stacked chip structures such as 2.5D and 3D designs. For example, the device 1000 may be used as a silicon interposer (SI) in 2.5D integrated chip design.

FIGS. 11A and 11B are graphical plots illustrating simulated performance of the two phase closed magnetic core coupled device 1000 as a function of frequency. In one embodiment, simulated values for the performance of the device 1000 are computed by using HFSS (High Frequency Structure Simulator) simulation tool for passive devices.

Referring to FIG. 11A, graphical plots 1100, 1102 illustrate inductance value (Y1-axis) and Quality (Q) factor (Y2-axis) of each phase inductor (top and bottom) respectively measured over a range of frequencies (X-axis). Inductance values greater than 13.8 nH are achieved between the frequency range of approximately 10 MHz to approximately 170 MHz. Ratio of inductance value per unit area (measure of inductance density) is greater than 43 nH/mm2. A Q-factor of about 14.4 is achieved at a frequency of about 170 MHz. DC resistance of the inductor (RDC) is approximately equal to 92.5 mΩ due to the large winding thickness of 100 µm.

Referring to FIG. 11B, graphical plots 1104, 1106 illustrate mutual inductance and coupling coefficient respectively of the magnetically coupled inductors (top and bottom pair). A mutual inductance value that is greater than 11.9 nH is achieved between the frequency range of approximately 10 MHz to approximately 170 MHz and coupling coefficient of 0.92 is achieved at a frequency of about 170 MHz.

FIG. 12 illustrates in tabular form a comparison Table 1200 that compares the performance metrics of the devices 100, 500 and 900. The performance of the devices 100, 500, 900 is computed by using HFSS (High Frequency Structure Simulator) simulation tool/software for passive devices. The device 900 exceeds performance metrics such as DC inductance and inductor efficiency compared to device 100 and 500. Devices 500 and 900 provide more protection against EMI compared to device 100. Devices 100 and 900 have a comparable Q-factor rating compared to device 500. The complexity of the fabrication process generally increases starting with device 100 to device 500 and ending with device 900.

Figure 13:
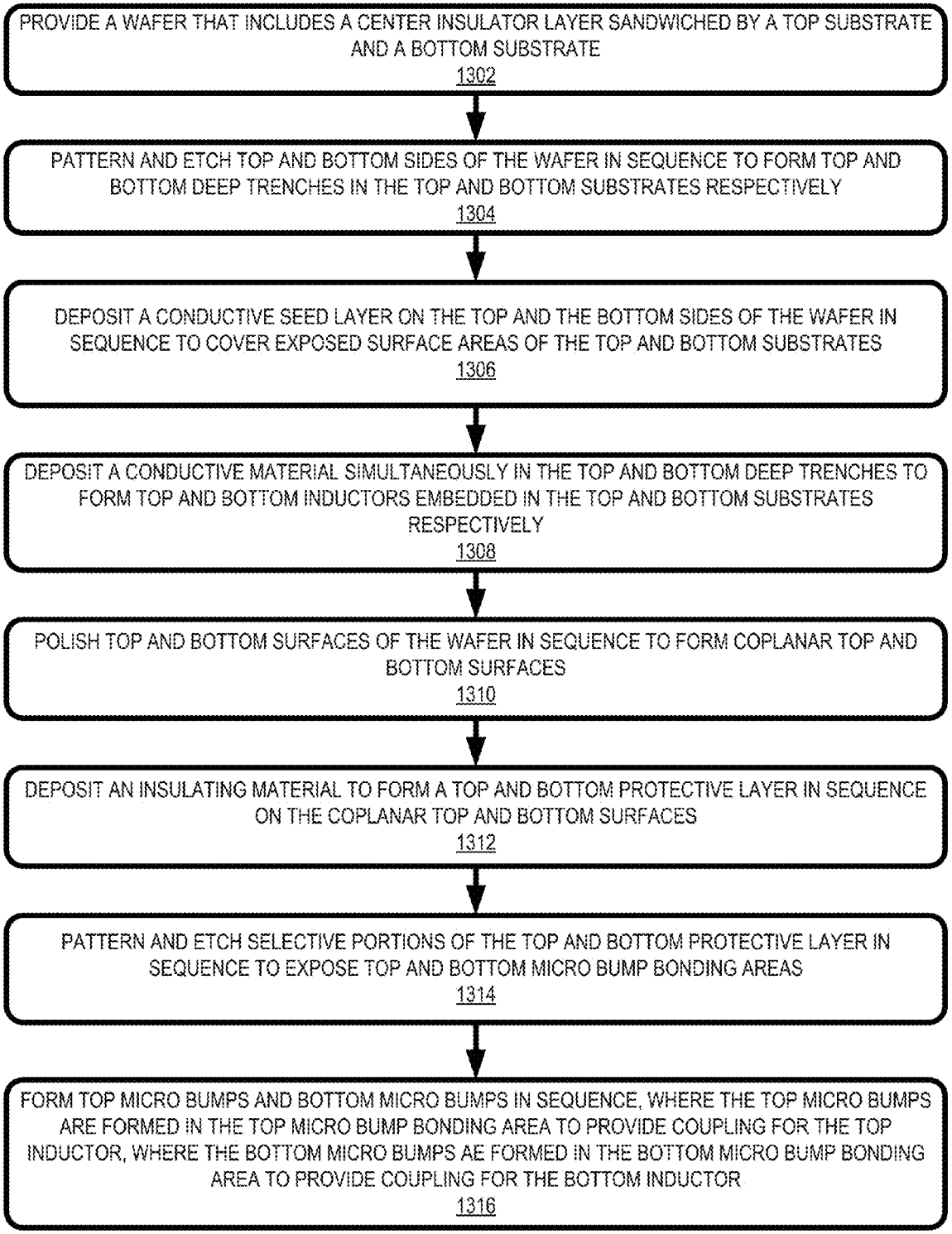
FIG. 13 is a flow diagram illustrating a process to implement techniques described herein to fabricate portion of a two phase air-core coupled inductor.

FIG. 13 is a flow chart illustrating an embodiment of a method 1300 to fabricate a portion of a two phase air core coupled inductor, e.g., device 100. The method 1300 begins at step 1302 when two insulator layers of two silicon substrates are bonded and etched to produce the wafer 110 having the top and bottom substrates separated by the center insulator layer described with reference to FIG. 1A. At step 1304, patterning followed by etching operation is performed on top and bottom sides of the wafer in sequence (e.g., first top side of the wafer and then bottom side of the wafer or vice versa) to form top and bottom deep trenches in the top and bottom substrates respectively. The patterning and etching operations may be the same as described with reference to FIGS. 2B-2F. At step 1306, a conductive seed layer is deposited on the top and the bottom sides of the wafer in sequence to cover exposed surface areas of the top and bottom substrates. Exposed surface areas may include the surface of the top and bottom substrates and side walls and base of the deep trenches. At step 1308, a conductive material is deposited simultaneously in the top and bottom deep trenches to form top and bottom inductors embedded in the top and bottom substrates respectively. The conductive material is deposited above the conductive seed layer.

At step 1310, top and bottom surfaces of the wafer are polished in sequence to form coplanar top and bottom surfaces. At step 1312, an insulating material is deposited to form a top and bottom protective layer in sequence on the coplanar top and bottom surfaces. At step 1314, patterning and etching is performed in sequence on selective portions of the top and bottom protective layer to expose top and bottom micro bump bonding areas. At step 1316, top micro bumps are formed in sequence in the top micro bump bonding area for electrically connecting the top inductor and the bottom micro bumps are formed in sequence in the bottom micro bump bonding area for electrically connecting the bottom inductor respectively.

The order in which any process or method described herein is not intended to be construed as a limitation, and any number of the described process blocks can be combined in any order to implement the process, method or alternate method. Additionally, individual blocks may be deleted from the process without departing from the spirit and scope of the subject matter described herein. Furthermore, the process may be implemented in any suitable hardware, software, firmware, or a combination thereof, without departing from the scope of the invention.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
a substrate, wherein the substrate comprises top and bottom semiconductor substrates sandwiching a center insulator layer, wherein the center insulator layer comprises a material different from the top and bottom semiconductor substrates;
a top inductor embedded in the top semiconductor substrate, wherein a portion of the top semiconductor substrate includes a top deep trench spiral and conductive material fills the top deep trench spiral to form the top inductor;
a bottom inductor embedded in the bottom semiconductor substrate, wherein a portion of the bottom semiconductor substrate includes a bottom deep trench spiral and conductive material fills the bottom deep trench spiral to form the bottom inductor; and
the top inductor and the bottom inductor are aligned along an axis perpendicular to the center insulator layer, the top inductor is configured to be magnetically coupled across the center insulator layer to the bottom inductor.

2. The device of claim 1, wherein the top inductor is substantially identical to the bottom inductor, the top inductor and the bottom inductor being symmetrically disposed on either side of the center insulator layer as mirror images.

3. The device of claim 1, wherein the top inductor is magnetically coupled to the bottom inductor by a non-magnetic material.

4. The device of claim 1, further comprising:
a pair of magnetic cores configured to sandwich the top inductor, the center insulator layer and the bottom inductor, wherein the pair of magnetic cores limits electromagnetic interference caused by energizing the top inductor and the bottom inductor.

5. The device of claim 1, further comprising:
a first closed-loop magnetic core configured to wrap a first portion of the top inductor, the center insulator layer and the bottom inductor, wherein the first closed-loop magnetic core is implemented in the form of an open ended rectangular sleeve; and
a second closed-loop magnetic core configured to wrap a second portion of the top inductor, the center insulator layer and the bottom inductor, wherein the second closed-loop magnetic core is implemented in the form of the open ended rectangular sleeve.

6. The device of claim 1, wherein a thickness of the top substrate is equal to a height of the top deep trench spiral, wherein a thickness of the bottom substrate is equal to a height of the bottom deep trench spiral.

7. The device of claim 1, wherein the top deep trench spiral has a rectangular cross section, wherein an aspect ratio of the top deep trench spiral ranges from 3:1 to 10:1.

8. The device of claim 1, wherein the top deep trench spiral is configured in a shape selectable to be at least one of a rectangular spiral, a circular spiral, and an oval spiral, wherein the top deep trench spiral includes N turns, N being an integer greater than one, wherein the $N^{th}$ turn is offset from the $(N-1)^{th}$ turn by a configurable distance.

9. The device of claim 8, wherein the configurable distance is equal to a width of the top deep trench.

10. The device of claim 1, wherein the bottom deep trench spiral has a rectangular cross section, wherein an aspect ratio of the bottom deep trench spiral ranges from 3:1 to 10:1.

11. The device of claim 1, wherein the bottom deep trench spiral is configured in a shape selectable to be at least one of a rectangular spiral, a circular spiral, and an oval spiral, wherein the bottom deep trench spiral includes N turns, N being an integer greater than one, wherein the $N^{th}$ turn is offset from the $(N-1)^{th}$ turn by a configurable distance.

12. A device comprising:
a substrate comprising top and bottom substrates, wherein the top substrate comprises a top deep trench spiral and the bottom substrate comprises a bottom deep trench spiral;
a top inductor embedded in the top substrate, wherein the top inductor comprises a conductive material filling the top deep trench spiral;
a bottom inductor embedded in the bottom substrate, wherein the bottom inductor comprises a conductive material filling the bottom deep trench spiral;
a center insulator layer sandwiched by the top substrate and the bottom substrate, wherein the center insulator layer comprises a material different from the top and bottom substrates;
a first closed-loop magnetic core configured to wrap a first portion of the top inductor, the center insulator layer and the bottom inductor with a ferromagnetic material, wherein the first closed-loop magnetic core is in the form of a rectangular sleeve; and
a second closed-loop magnetic core configured to wrap a second portion of the top inductor, the center insulator layer and the bottom inductor with the ferromagnetic material, wherein the second closed-loop magnetic core is in the form of the rectangular sleeve.

13. The device of claim 12, wherein the first and second closed-loop magnetic cores are configured to limit electromagnetic interference caused by energizing the top inductor and the bottom inductor, and to further improve inductance density and coupling coefficient.

14. The device of claim 12, wherein the first and second closed-loop magnetic cores are fabricated from a ferromagnetic material, wherein the ferromagnetic material is a combination of iron (Fe), nickel (Ni), cobalt (Co) and aluminum oxide (Al—O).

15. The device of claim 12, further comprising:
top and bottom conductive micro bumps being configured to enable electrical connection of the top and bottom inductors with other circuits packaged in a stacked chip arrangement.

16. The device of claim 12, wherein the top inductor and the bottom inductor are symmetrically disposed on either side of the center insulator layer as mirror images.

17. The device of claim 12, wherein the first and second closed-loop magnetic cores include a longer side or dimension of the top and bottom inductors.

18. The device of claim 17, wherein the longer dimension of the top and bottom inductors is around 800 μm.

19. The device of claim 12 comprising a protective layer covering the top and bottom inductors and the first and second closed-loop magnetic cores.

* * * * *